US012750974B2

(12) United States Patent
Clerc et al.

(10) Patent No.: US 12,750,974 B2
(45) Date of Patent: Sep. 29, 2026

(54) FLUID IMMERSION COOLING ASSEMBLY

(71) Applicant: CGG Services SAS, Massy Cedex (FR)

(72) Inventors: Laurent Clerc, Houston, TX (US); Jean-Marc Denis, Massy Cedex (FR); Jean-Yves Blanc, Massy Cedex (FR)

(73) Assignee: CGG Services SAS, Massy Cedex (FR)

( * ) Notice: Subject to any disclaimer, the term of this patent is extended or adjusted under 35 U.S.C. 154(b) by 245 days.

(21) Appl. No.: 18/761,817

(22) Filed: Jul. 2, 2024

(65) Prior Publication Data

US 2026/0013074 A1 Jan. 8, 2026

(51) Int. Cl.
*H05K 7/20* (2006.01)

(52) U.S. Cl.
CPC ..... *H05K 7/20272* (2013.01); *H05K 7/20236* (2013.01); *H05K 7/20781* (2013.01)

(58) Field of Classification Search
CPC ........... H05K 7/20781; H05K 7/20763; H05K 7/203; H05K 7/20272; H05K 7/20236; F28F 9/0234; F28F 2280/00; F28D 7/16
See application file for complete search history.

(56) References Cited

U.S. PATENT DOCUMENTS

2010/0328889 A1 12/2010 Campbell et al.
2014/0240916 A1 8/2014 Daidzic
2017/0311484 A1 10/2017 Ozyalcin et al.
2020/0267872 A1* 8/2020 Harada .............. H05K 7/20272
2022/0369504 A1 11/2022 Clerc et al.
2022/0418156 A1 12/2022 Cushen et al.
2023/0358486 A1* 11/2023 Xiao ..................... F28F 9/0243
2024/0057286 A1* 2/2024 Lin .................... H05K 7/20645

FOREIGN PATENT DOCUMENTS

WO WO-2025210207 A1 * 10/2025 ......... H05K 7/20272

OTHER PUBLICATIONS

Search Report issued for corresponding international patent application No. PCT/US2025/036123, mailed Sep. 2, 2025 (3 pages).
Written Opinion issued for corresponding international patent application No. PCT/US2025/036123, mailed Sep. 2, 2025 (5 pages).

* cited by examiner

*Primary Examiner* — Robert J Hoffberg
*Assistant Examiner* — Jamil Alexander Decker
(74) *Attorney, Agent, or Firm* — Osha Bergman Watanabe & Burton LLP

(57) ABSTRACT

An assembly for directing a fluid flow of a dielectric oil through a server includes shrouds and a manifold including ducts, a recess, cavities, and channels. Each shroud houses a radiator that is connected to a conduit of a heat exchange loop. The manifold is removably coupled to the shrouds. The ducts fluidly connect to the shrouds and are formed along an upper surface of the manifold. The recess receives a lower end of a server. The cavities are formed within the recess, and each cavity houses one or more micropumps that circulate the dielectric oil through the server. The channels fluidly connect the micropumps and the ducts such that the dielectric oil is transferred from the ducts to the micropumps through the channels.

20 Claims, 9 Drawing Sheets

FLUID IMMERSION COOLING ASSEMBLY

BACKGROUND

Due to the ubiquitous nature of computing devices, it is becoming increasingly common to house the computing devices in a primary storage location of a facility. This primary storage location may be referred to as a "data center," and typically includes storage structures such as large racks or shelving units that serve to stack the computing devices in a vertical orientation. In this way, the storage structures create a clean and tidy environment necessary for a human operator to not trip or injure themselves on exposed computing devices.

However, it is commonly known that computing devices necessarily emit heat during their usage. Furthermore, data centers typically rely on convective air currents, which may be produced by the motion of overhead fans and/or Air Conditioning (AC) units of the facility, to remove heat from a component of the computing device. In addition, the stacked nature of the computing devices in the storage structure inhibits the ability of a convective air current to effectively pass through a space between the computing devices, as the overhead fans and/or AC units are not positioned directly facing the space between the stacked computing devices. Moreover, as Thermal Design Power (TDP) increases, or an expected maximum amount of heat generated increases, the convective air currents may provide insufficient cooling. That is, the density of heat produced by a computing device may be too large to be removed by natural convective currents alone, such that forced convection is necessary to cool the computing device.

SUMMARY

Embodiments disclosed herein relate to an assembly for directing a fluid flow of a dielectric oil through a server. The assembly includes shrouds and a manifold including ducts, a recess, cavities, and channels. Each shroud houses a radiator that is connected to a conduit of a heat exchange loop. The manifold is removably coupled to the shrouds. The ducts fluidly connect to the shrouds and are formed along an upper surface of the manifold. The recess receives a lower end of a server. The cavities are formed within the recess, and each cavity houses one or more micropumps that circulate the dielectric oil through the server. The channels fluidly connect the micropumps and the ducts such that the dielectric oil is transferred from the ducts to the micropumps through the channels.

Embodiments disclosed herein further relate to a method utilizing an assembly to direct a fluid flow of a dielectric oil through a server. The method includes housing micropumps within cavities formed in a recess of a manifold. The method further includes housing a radiator connected to a conduit of a heat exchange loop within each shroud of a plurality of shrouds. A lower end of a server is received within the recess of the manifold. The shrouds are fluidly connected to the manifold with ducts formed along an upper surface of the manifold. The ducts and the micropumps are fluidly connected with channels such that the dielectric oil is transferred from the ducts to the micropumps through the channels. The method also includes circulating the dielectric oil through the server by way of the micropumps.

Embodiments disclosed herein additionally relate to a computer readable medium that stores instructions executed by a processor of a 3D printer. The instructions cause the 3D printer to form an assembly by depositing a filament on a substrate in successive, vertically stacked layers with an extrusion nozzle of the 3D printer to form components of the assembly. The assembly includes shrouds and a manifold including ducts, a recess, cavities, and channels. Each shroud houses a radiator that is connected to a conduit of a heat exchange loop. The manifold is removably coupled to the shrouds. The ducts fluidly connect to the shrouds and are formed along an upper surface of the manifold. The recess receives a lower end of a server. The cavities are formed within the recess, and each cavity houses one or more micropumps that circulate the dielectric oil through the server. The channels fluidly connect the micropumps and the ducts such that the dielectric oil is transferred from the ducts to the micropumps through the channels.

BRIEF DESCRIPTION OF DRAWINGS

Specific embodiments of the disclosed technology will now be described in detail with reference to the accompanying figures. Like elements in the various figures are denoted by like reference numerals for consistency. The sizes and relative positions of elements in the drawings are not necessarily drawn to scale. For example, the shapes of various elements and angles are not necessarily drawn to scale, and some of these elements may be arbitrarily enlarged and positioned to improve drawing legibility.

DETAILED DESCRIPTION

Figure 1:
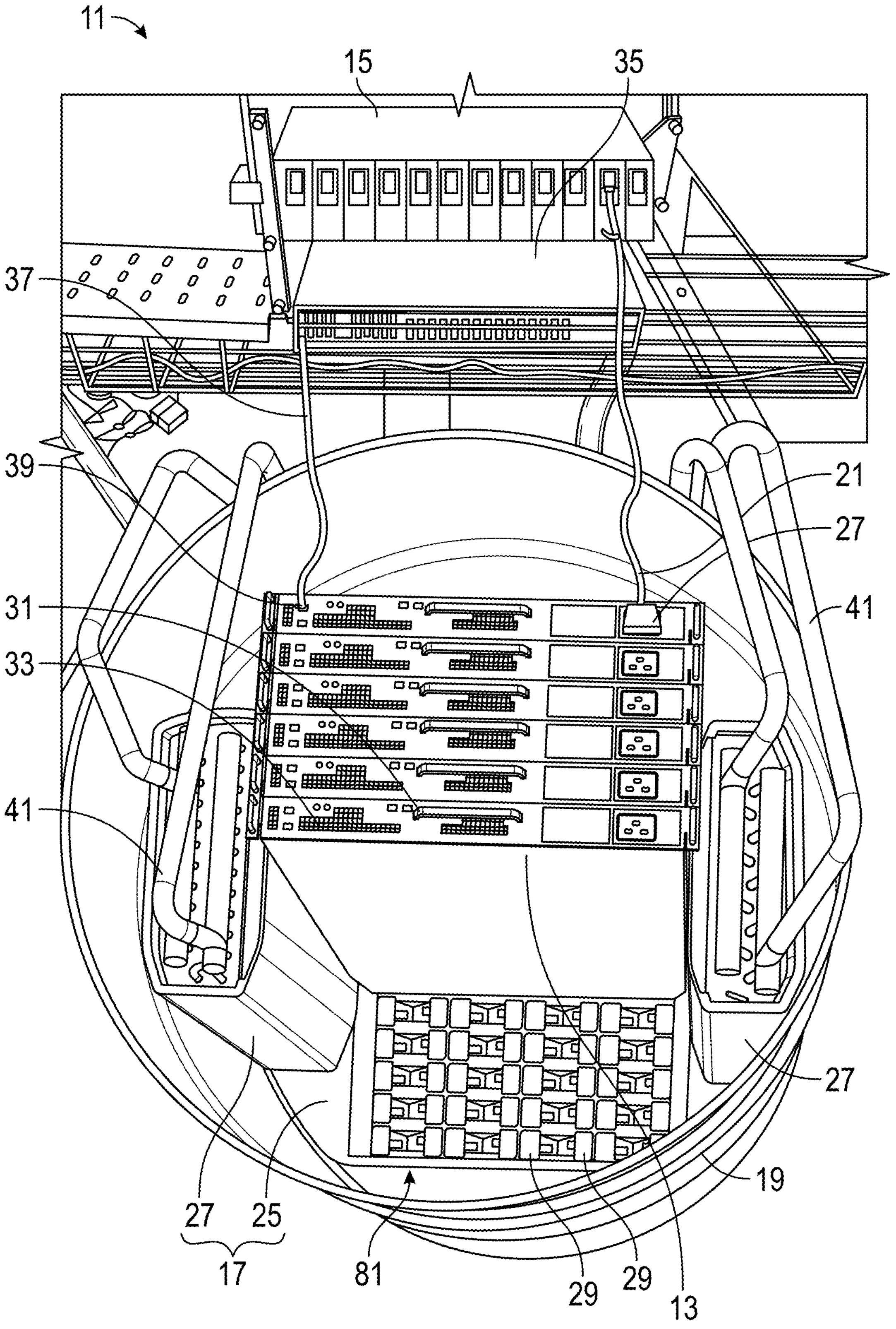
FIG. 1 depicts a system in accordance with one or more embodiments disclosed herein.

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not intended to imply or create any particular ordering of the elements nor to limit any element to being only a single element unless expressly disclosed, such as using the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

In addition, throughout the application, the terms "upper" and "lower" may be used to describe the position of an element of the invention. In this respect, the term "upper" denotes an element disposed above a corresponding "lower" element in a vertical direction, while the term "lower" conversely describes an element disposed below a corresponding "upper" element in the vertical direction. Likewise, the term "axial" refers to an orientation substantially parallel to a central axis of a rounded or cylindrical component of the invention, while the term "radial" refers to an orientation orthogonal to the central axis of the component. Similarly, the term "inner" refers to an orientation closer to a center of an object than a corresponding "outer" orientation.

In general, embodiments of the invention are directed towards an assembly configured to direct a fluid flow of a first cooling fluid, embodied as a dielectric oil or liquid, through a series of one or more servers. The assembly is formed of a plurality of Three Dimensional (3D) printed structures connected together and is placed in a container containing the dielectric oil. The assembly includes a manifold and a plurality of shrouds that each house a radiator connected to a conduit of a heat exchange loop. The manifold includes a plurality of ducts that fluidly connect the manifold to the plurality of shrouds. The manifold also includes a plurality of cavities formed within a recess of the manifold, and each cavity houses one or more micropumps. The recess is designed to receive the servers, and the micropumps are utilized to circulate dielectric oil into and through the servers. Further, the manifold includes a plurality of channels that fluidly connect the micropumps and the plurality of ducts. In this way, the assembly is configured, as a whole, to control and direct a flow of a dielectric oil used to cool the servers.

As shown in FIG. 1, a fluid immersion cooling system 11 includes a server 13 that is powered by a power distribution system 15 and is positioned upon an assembly 17 disposed in a container 19. The server 13 may be embodied, for example, as a blade server or a rack server. In addition, the power distribution system 15 may be embodied as an Alternate Current (AC)/Direct Current (DC) converter that converts a received AC input power to a DC output power to be used by the server 13. The power distribution system 15 may further format the current of the received AC input power in such a way so as to render a power supply (not shown) of the server 13 redundant, or so that the power supply may be removed entirely. In this regard, the current formatting includes AC to DC conversion or voltage conversion. Power is transferred from the power distribution system 15 to the server 13 by way of a power cable 21, which is an insulated wire configured to provide an electrical pathway for power output by the power distribution system 15. Additionally, power from the power cable 21 is received by the server 13 by way of a power terminal 23, which is a reception port, fixed to the server 13, that is electrically connected to the remainder of the components thereof.

Furthermore, the container 19 may be configured with an open top and may be formed of a metal such as a chrome-molybdenum steel alloy, a vanadium steel alloy, a nickel steel alloy, or an equivalent metal. Alternatively, the container 19 may be formed of a plastic polymer such as polyvinyl chloride (PVC), high-density polyethylene (HDPE), nylon, or polystyrene, for example. In one or more embodiments, the container 19 may be cylindrical shape as shown in FIG. 1, which offers internal force distribution benefits due to its rounded nature. However, the container 19 may take the form of a cube, rectangular prism, or other polyhedrons without departing from the nature of this disclosure, as these forms may provide other advantages appreciated by a person skilled in the art. Thus, as will be demonstrated by the following disclosure, the shape and constituent materials of the container 19 may take many differing forms in a non-limiting manner based upon the components to be contained therein.

For its part, the assembly 17 serves to advantageously provide an internal structure of the container 19 that facilitates the positioning and orientation of various other components of the system 11 within the container 19. The assembly 17 includes a manifold 25 and a plurality of shrouds 27. The manifold 25 receives and supports the server 13 and the plurality of shrouds 27 within the container 19. In addition, the manifold 25 houses a plurality of micropumps 29 designed to circulate dielectric oil (e.g., FIG. 3) within the system 11. Accordingly, the manifold 25 aids in the distribution of dielectric oil within the system 11. The structure and function(s) of the manifold 25 are discussed further in reference to FIGS. 2 and 4.

When the server 13 is supported by the assembly 17, a lower end of the server 13 is disposed within a recess (e.g., FIG. 4) of the manifold 25. As such, the entirety or a portion of the server 13 is supported and immersed in the dielectric oil. To remove the server 13 from the manifold 25, each server 13 includes a pair of server handles 31 that are fixed to a connection face 33 of the server 13 such that an operator can grip the server handles 31 and vertically lift the server 13 from the manifold 25. The server handles 31 may be formed with a rubberized coating to assist an operator in removing the server 13 from the system 11, and are generally formed with an inverted arcuate or semicircular shape to further aid in gripping the server 13.

In general, the server 13 is a computing device or system that provides network or cloud based services to connected devices (not shown) in a network (not shown) that includes the server 13. To this end, the server 13 is connected to a network switch 35 by way of a data cable 37, where the network switch 35 is a hub that interconnects the server 13 to the connected devices to form the network of connected devices. The data cable 37 is a wire that transmits electrical data signals from the server 13 to the network switch 35, and connects to a networking port 39 of the connection face 33 of the server 13. Accordingly, the networking port 39 is a data reception port, fixed to the server 13, that is electrically connected to the remainder of the components of the server 13 to allow data to be transmitted to and from the server 13.

Within the network, the server 13 provides additional resources or functionality to the connected devices, such as performing computations, functions, or applications on behalf of or at the behest of the connected devices. Alternatively, or additionally, the server 13 may provide data storage services to a connected device, or to facilitate communication between connected devices. However, the above description of the server 13 is not intended to be all-encompassing, as a server 13 may perform additional functions such as security services or media sharing services. Although not depicted in FIG. 1, the server 13 includes components disposed on a circuit board (e.g., FIG. 6) thereof such as a microprocessor, a processing unit such as a Central Processing Unit (CPU) and/or a Graphics Processing Unit (GPU), one or more storage media (e.g., a Hard Disk Drive (HDD), a Solid State Drive (SDD), or Random Access Memory (RAM)), and a communication device (e.g., ethernet, Wi-Fi, or other Local Area Network (LAN) or Wide Area Network (WAN) interconnects) such as a transceiver that serves to transmit and receive signals from the connected devices.

The server 13 generates a heat load as its components operate to provide the services described above. If a sufficiently large heat load is developed within the server 13, the server 13 may be detrimentally impacted, such as components of the server 13 becoming de-soldered, semi-conductors (not shown) of the server 13 not running at optimal efficiency due to the large heat load, or component burnout. Alternatively, the performance of the server 13 may be throttled or bottlenecked to reduce the heat output of the server 13, where the heat output would otherwise cause delays or interruptions in the server 13 functionality due to the repair or replacement of components damaged from the heat output. Thus, the container 19 contains a dielectric oil (e.g., mineral oil), that the server 13 is immersed in so that the dielectric oil absorbs heat from components of the server 13.

Due to the fact that the dielectric oil is contained in the container 19, the dielectric oil itself is only capable of redistributing the heat load from the server 13 to the extremities of the container 19. That is, the dielectric oil is not removed from the container 19 during the process of cooling the server 13. Thus, to remove heat from the dielectric oil, the system 11 also includes conduits 41 that contain a second cooling liquid (not shown) such as water. The conduits 41 connect to radiators (e.g., FIG. 2) disposed within each shroud 27, and are further connected to fluid pipes (e.g., FIG. 5) to form a heat exchange loop (e.g., FIG. 5). The fluid pipes include or may be coupled to pumps (not shown) that circulate the water through the conduits 41. For example, the water circulation may originate from a chilled water cooling loop in a datacenter.

Figure 2:
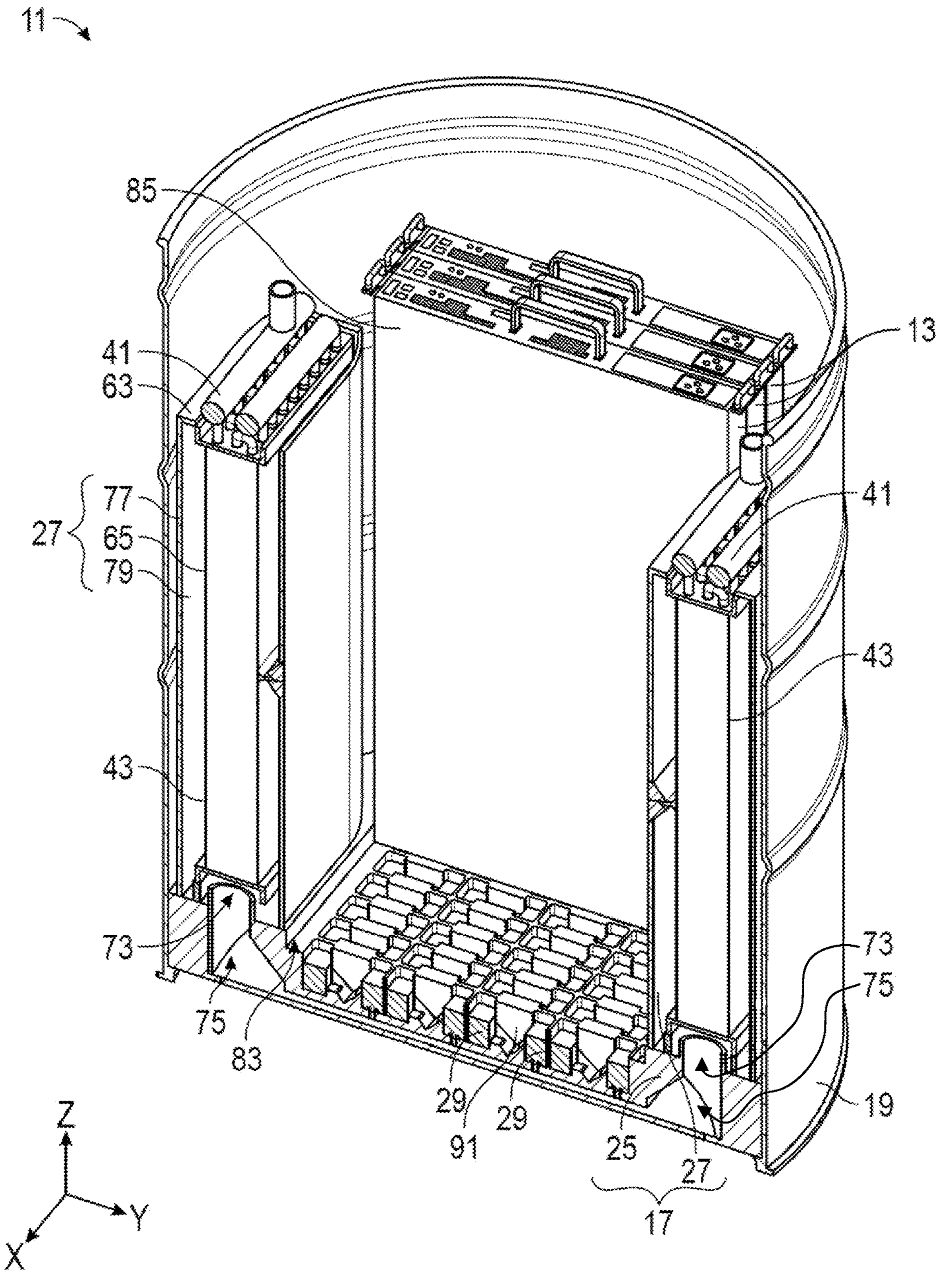
FIG. 2 depicts a cross-sectional view of a system in accordance with one or more embodiments disclosed herein.
Figure 3:
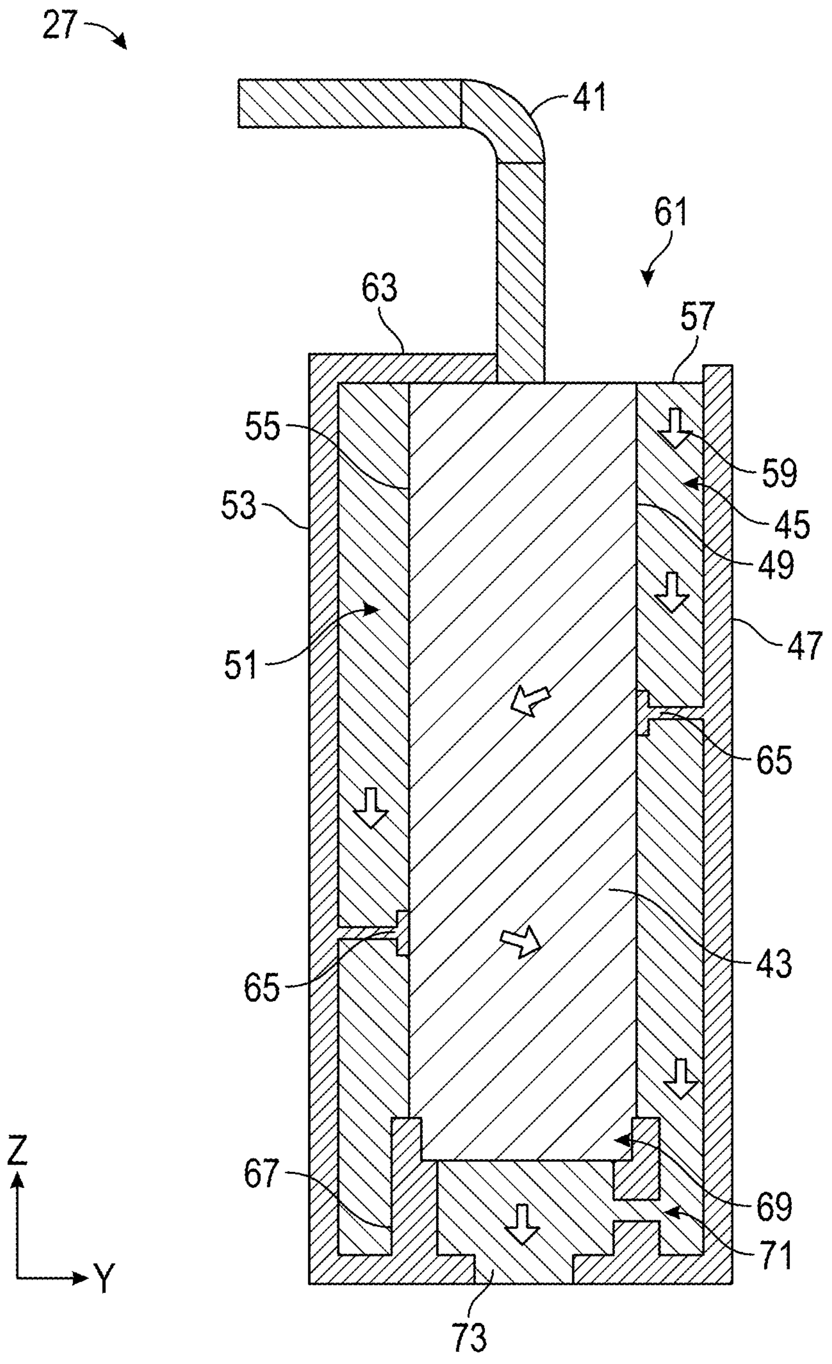
FIG. 3 depicts a cross-sectional view of a shroud in accordance with one or more embodiments disclosed herein.

Each shroud 27 of the plurality of shrouds 27 of the assembly 17 is hollow and includes one or more cooling passages (e.g., FIG. 3). A radiator is housed within each shroud 27 of the plurality of shrouds 27. Further, each shroud 27 is fluidly connected to the manifold 25. The structure and functions of the plurality of shrouds 27 are discussed further in reference to FIGS. 2 and 3.

Turning to FIG. 2, FIG. 2 depicts a cross-sectional view of an assembly 17 positioning and supporting various components of a fluid immersion cooling system 11. In general, the components of the assembly 17 (i.e., the manifold 25 and the plurality of shrouds 27) may be formed as 3D printed structures that are manufactured by depositing a filament onto a substrate with a heated extrusion nozzle, which is further discussed in relation to FIG. 7. In an alternative embodiment, the manifold 25 and/or the plurality of shrouds 27 may be formed by a variety of modeling processes (e.g., injection molding, casting, etc.) appreciated by a person having ordinary skill in the art. Thus, the formation of the manifold 25 and the plurality of shrouds 27 is not limited to 3D printing methods. Further examples of methods for forming the components of the assembly 17 are further discussed in relation to FIG. 7, below.

As shown in FIG. 2, each shroud 27 of the plurality of shrouds 27 houses an in-line radiator 43 within its interior. As such, the shrouds 27 position the conduits 41 and encased radiators 43 within the container 19. As discussed above in relation to FIG. 1, conduits 41 are connected, at one end, to a radiator 43 that is disposed within each shroud 27. Each radiator 43 includes an internal core formed as a series of tubes and fins that serve to elongate the fluid flow path of the water disposed in the conduits 41. The radiators 43 are immersed in the dielectric oil within the plurality of shrouds 27 during the immersion cooling process. Therefore, the elongated fluid flow path for the water within each radiator 43 is immersed in the dielectric oil as well. In this way, the elongated fluid flow path of the water allows the water more time to absorb heat from the dielectric oil. This, in turn, increases the cooling rate of the system 11 as a whole since the water in the conduits 41 will carry away more heat per pass through the plurality of shrouds 27 when the water is routed through the radiators 43 than an embodiment in which radiators 43 are not present.

Prior to describing additional components of FIG. 2, we turn briefly to FIG. 3 to further detail the structure and functionalities of one or more embodiments of a shroud 27. Specifically, FIG. 3 depicts a cross-sectional view of a shroud 27 containing a radiator 43 in accordance with one or more embodiments discussed herein. In one or more embodiments, each shroud 27 of the plurality of shrouds 27 generally has a form substantially similar to the shape of the radiators 43 to be encased. As such, in FIG. 3, the depicted shroud 27 has the form of a hollow rectangular prism in order to house a radiator 43 of a similar shape. However, the shroud 27 has a width greater than a width of the radiator 43 in the y-direction. As such, space is formed between the walls of the shroud 27 and the sides of the radiator 43 extending in the z-direction. Specifically, a first passage 45 is formed between a first wall 47 of the shroud 27 and a first side 49 of the radiator 43, and a second passage 51 is formed between a second wall 53 of the shroud 27 and a second side 55 of the radiator 43.

Dielectric oil 57 is permitted to flow within the shroud 27 through the first passage 45 and the second passage 51. The motion of the dielectric oil 57 is depicted in FIG. 3 as a fluid flow path 59, which is shown as a series of arrows denoting the direction of the fluid flow of the dielectric oil 57. The dielectric oil 57 may enter the shroud 27 through an opening 61 of the shroud 27 disposed at an upper end of the shroud 27. In one or more embodiments, each shroud 27 includes a lip 63 at its upper end that covers a portion of the opening 61. In this way, the lip 63 may cover an upper end of the first passage 45 or the second passage 51. Here, in FIG. 3, the lip 63 covers the upper end of the second passage 51 of the shroud 27. Thus, the dielectric oil 57 entering the shroud 27 through the opening 61 is directed solely towards the first passage 45, and naturally flows to the first passage 45 therefrom.

In one or more embodiments, the shroud 27 may include one or more flow protrusions 65. The flow protrusions 65 are protrusions that extend the length of the shroud 27 in the x-direction and extend toward the radiator 43 in the y-direction from the interior of the shroud 27. In one or more embodiments, each flow protrusion 65 is an integrally formed component of the shroud 27. Alternatively, in one or more embodiments, the flow protrusions 65 of a shroud 27 may be formed as extrinsic components fixed between two body sections (e.g., FIG. 2) of a shroud 27. That is, as discussed further in relation to the embodiment depicted in FIG. 2, a shroud 27 may be formed of a plurality of body sections.

Here, in FIG. 3, a flow protrusion 65 protrudes within the first passage 45 of the shroud 27, extending from the first wall 47 of the shroud 27 until the flow protrusion 65 abuts against the fins forming the first side 49 of the radiator 43. Consequently, the flow protrusion 65 of FIG. 3 creates a seal within the first passage 45, thereby isolating the portion of the first passage 45 above the flow protrusion 65 from the portion of the first passage 45 below the flow protrusion 65. As such, dielectric oil 57 cannot pass through the flow protrusion 65, and direct fluid communication between the portion of the first passage 45 above the flow protrusion 65 and the portion of the first passage 45 below the flow protrusion 65 is blocked by the flow protrusion 65. Therefore, upon reaching the flow protrusion 65, the dielectric oil 57 flowing in the first passage 45 is redirected by the flow protrusion 65 to pass into the second passage 51 through the radiator 43. In turn, the radiator 43 absorbs heat from the dielectric oil 57 as the dielectric oil 57 flows through the radiator 43.

One or more dimensions of the shroud 27 may be shaped to closely match the dimensions of the radiator 43. For example, in FIG. 3, the dimensions of the shroud 27 and the flow protrusions 65 closely match the dimensions of the radiator 43 in the x-direction (i.e., the direction extending into/out of the page of FIG. 3). In this regard, the phrase "closely match[ing] the dimensions of the radiator 43," implies that a gap between the exterior of the radiator 43 and the interior of the shroud 27 in the x-direction is less than 1/16 of an inch (approximately 1.6 mm), for example. Accordingly, the relatively tight dimensions formed between the radiator 43 and the shroud 27 in the x-direction force the dielectric oil 57 to pass through the radiator 43, rather than around the radiator 43, which further increases the cooling effect provided thereby.

In one or more embodiments, the shroud 27 may include a single flow protrusion 65. Alternatively, in one or more embodiments, and as depicted in FIG. 3, the shroud 27 may include a plurality of flow protrusions 65. In particular, the shroud 27 may include flow protrusions 65 within both the first passage 45 and the second passage 51. A flow protrusion 65 within the second passage 51 extends from the second wall 53 of the shroud 27 until the flow protrusion 65 abuts against the fins forming the second side 55 of the radiator 43. As such, the flow protrusion 65 of the second passage 51 creates a seal within the second passage 51 which isolates the portion of the second passage 51 above the flow protrusion 65 from the portion of the second passage 51 below the flow protrusion 65. The dielectric oil 57 entering the second passage 51 from the first passage 45 through the radiator 43 may travel within the second passage 51 until reaching the flow protrusion 65 of the second passage 51. However, upon reaching the flow protrusion 65 of the second passage 51, the dielectric oil 57 flowing in the second passage 51 is redirected by the flow protrusion 65 to pass back into the first passage 45 through the radiator 43.

Ultimately, the use of flow protrusions 65 permits a multi-pass fluid flow of the dielectric oil 57 through the radiator 43. The number of flow protrusions 65 within a shroud 27 may depend on several different factors of the system 11 (e.g., dielectric oil 57 characteristics, energy requirements, temperature requirements, etc.). In one or more embodiments, the shroud 27 may include a plurality of flow protrusions 65 within the first passage 45 and/or the second passage 51. Conceptually, the difference in the number of flow protrusions 65 disposed within the first passage 45 and the number of flow protrusions 65 disposed within the second passage 51 may be one or zero. In addition, in or more embodiments including flow protrusions 65 within both the first passage 45 and the second passage 51, the flow protrusions 65 of the first passage 45 are vertically offset from the flow protrusions 65 of the second passage 51 within the shroud 27 as depicted in FIG. 3.

In one or more embodiments, the shroud 27 includes a support 67 protruding vertically from the bottom surface of the shroud 27. In one or more embodiments, the support 67 extends the length of the shroud 27 in the x-direction. The support 67 is configured to support and position the radiator 43 within the shroud 27. In particular, the radiator 43 is configured to rest atop the support 67. In one or more embodiments, the top surface of the support 67 includes indentations 69 that further facilitate the positioning of the radiator 43. The indentations 69 create flat faces atop the support 67, and the separation of the flat faces created by the indentations 69 is sized to closely match the dimensions of the radiator 43. In this way, the support 67 laterally fixes the position of the radiator 43 within the shroud 27. Further, in one or more embodiments, the position of the radiator 43 may be laterally fixed within the shroud 27 by the plurality of flow protrusions 65 abutting against the radiator 43.

In one or more embodiments, one or more walls of the support 67 that extend parallel to the first wall 47 and second wall 53 of the shroud 27 include a plurality of apertures 71. These apertures 71 permit the dielectric oil 57 to flow through the walls of the support 67, thereby fluidly connecting the lower end of the first passage 45 and/or the second passage 51 with one or more complementary ducts 73 of the shroud 27. Further, in one or more embodiments, the support 67 may be formed integrally within the shroud 27. Alternatively, in one or more embodiments, the support 67 may be a separate component that is secured to the lower end of the shroud 27.

The complementary ducts 73 of the shroud 27 may be embodied as apertures configured to receive a plurality of ducts (e.g., FIG. 2) of the manifold 25 and/or as tubular protrusions configured to extend into the plurality of ducts of the manifold 25. Accordingly, the complementary ducts 73 of the shroud 27 are configured to provide fluid communication between the shroud 27 and the manifold 25. Further, in one or more embodiments, the complementary ducts 73 of the shroud 27 also serve to fix and position the shroud 27 upon the manifold 25. Alternatively, in one or more embodiments, the radiator 43 may rest against a lower end of the shroud 27 (e.g., FIG. 6). As a result, each complementary duct 73 of the shroud 27 may be situated at the lower end of the first passage 45 or the second passage 51.

Turning back to FIG. 2, FIG. 2 depicts a plurality of shrouds 27 fixed upon a manifold 25. In this non-limiting example, the plurality of ducts 75 of the manifold 25 are embodied as tubular protrusions extending vertically through the complementary ducts 73 of the shrouds 27 embodied as apertures.

As depicted in FIG. 2, in one or more embodiments, each shroud 27 of the plurality of shrouds 27 may be formed of a plurality of body sections. In this way, a shroud 27 may be disassembled for maintenance of the radiator 43 or the shroud 27 itself. Accordingly, individual pieces of the shroud 27 may be replaced with upgraded, undamaged, or different pieces. In addition, these embodiments (i.e., a shroud 27 having a plurality of body sections) may advantageously aid the ease of the assembly process of encasing a radiator 43 within a shroud 27.

Here, in FIG. 2, each shroud 27 is formed of an upper body section 77 and a lower body section 79. The upper body section 77 of each shroud 27 includes an opening 61 and a lip 63 at its upper end. The lower end of the upper body section 77 is open such that the radiator 43 may extend through the lower end of the upper body section 77 into the lower body section 79. Accordingly, the upper end of the lower body section 79 is open to receive the portion of the radiator 43 protruding from the upper body section 77. The lower end of the lower body section 79 includes one or more complementary ducts 73 configured to mate with the plurality of ducts 75 of the manifold 25. The upper body section 77 and the lower body section 79 may be connected to one another by any connection means known to one of ordinary skill in the art (e.g., snap-fit joints, bonding agents, interference fittings, etc.). The upper body section 77 and the lower body section 79 may also be formed as a single part.

In addition, the upper body section 77 and/or the lower body section 79 may include one or more integrally formed flow protrusions 65. Alternatively, in one or more embodiments, the flow protrusions 65 of a shroud 27 may be formed as extrinsic components. In this way, the flow protrusions 65 of a shroud 27 may be secured within the shroud 27 between body sections 77, 79 of the shroud 27. In one or more embodiments, only one flow protrusion 65 may be disposed between two connecting body sections 77, 79. Thus, in order for a shroud 27 to include two flow protrusions 65, the shroud 27 must include at least three body sections. In FIG. 2, the flow protrusion 65 of each shroud 27 is disposed and secured between the upper body section 77 and the lower body section 79.

As described above, the plurality of shrouds 27 rest upon the manifold 25. In addition, one or more servers 13 of the system 11 are situated upon the manifold 25. As such, a height (i.e., measured in the z-direction) of the plurality of shrouds 27 within the container 19 while situated upon the manifold 25 may be less than or equal to the height (i.e., measured in the z-direction) of the servers 13. Moreover, the height of the servers 13 is less than or equal to a height (i.e., measured in the z-direction) of the container 19, such that the servers 13 do not extend beyond the container 19 when disposed therein. To this end, as the dielectric oil 57 is circulated through the servers 13, the dielectric oil 57 will flow out of the upper ends of the servers 13 and into the openings 61 of the plurality of shrouds 27 situated below an upper opening of the cylindrical container 19.

The manifold 25 is sized and shaped to fit within the container 19 of the system 11. In the non-limiting examples of FIGS. 1 and 2, the container 19 is cylindrical. Therefore, the manifold 25 is configured with a substantially cylindrical form configured with a diameter, rather than a width. The diameter of the manifold 25 is smaller than a diameter of the cylindrical container 19. Due to the cylindrical shape of the manifold 25, there is little to no dielectric oil 57 surrounding the manifold 25 itself within the container 19. That is, in the embodiments depicted in FIGS. 1 and 2, the manifold 25 abuts against the container 19 itself. The rounded nature of the manifold 25 reduces the number of stress points on the manifold 25. More specifically, and with respect to the container 19 as well as the manifold 25, a cylindrical form evenly distributes any surface forces away from their location. In one or more embodiments, the manifold 25 may also be developed with flat faces 81 (e.g., FIG. 1) to reduce the production cost thereof, or have an entirely cylindrical profile as depicted in FIG. 2 to provide a more robust immersion cooling system 11 with reduced stress risers. In this way, a particular embodiment of the manifold 25 may be selected for use based upon a predetermined amount of heat that is contemplated to be produced by the plurality of servers 13, or based upon budget constraints of an immersion cooling system 11 as a whole.

Figure 4:
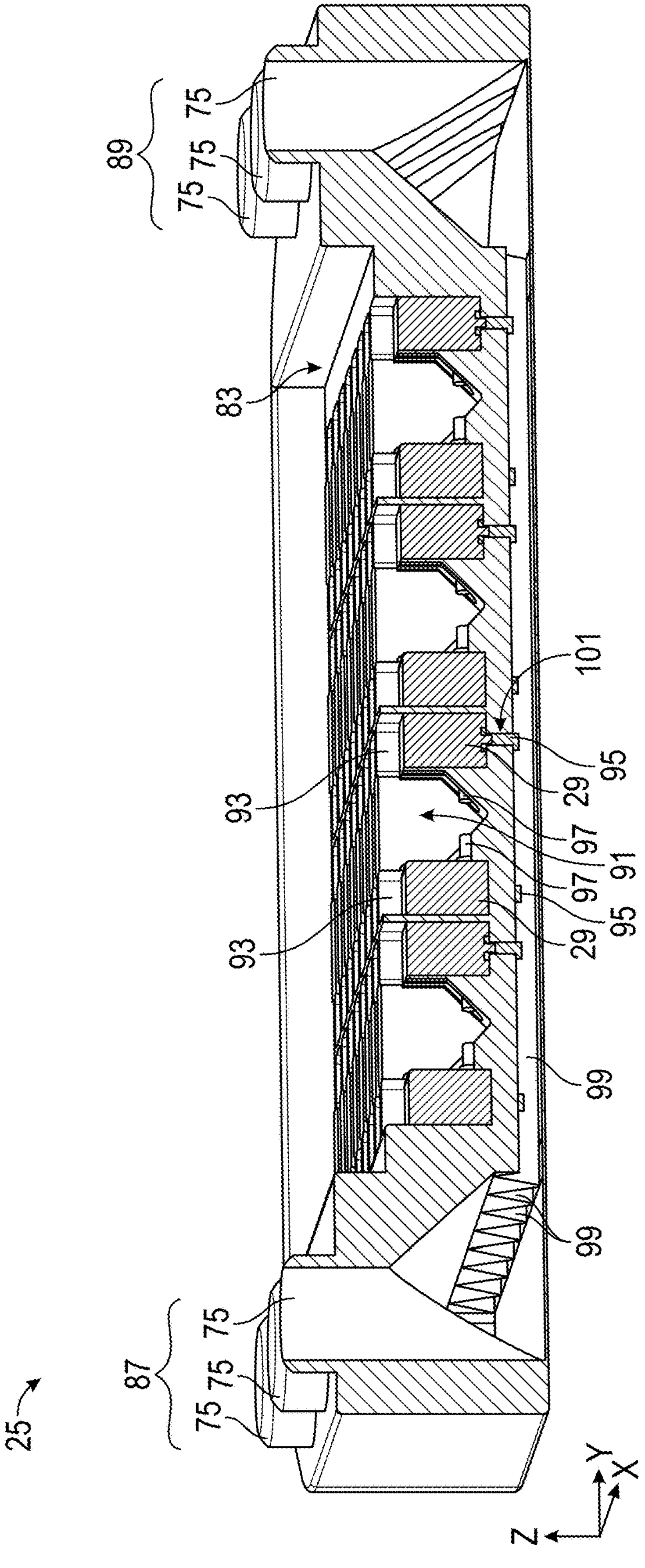
FIG. 4 depicts a cross-sectional view of a manifold in accordance with one or more embodiments disclosed herein.

FIG. 4 depicts a cross-sectional view of a manifold 25 in accordance with one or more embodiments discussed herein. The manifold 25 includes a recess 83 that is sized to accommodate one or more servers 13, which are positioned such that circuit boards (e.g., FIG. 6) of the servers 13 are immersed within the dielectric oil 57 in the container 19. Each server 13 includes a server casing 85 (e.g., FIG. 2), which is a metal or plastic casing that serves to protect and enshroud a circuit board of the servers 13. Thus, as the dielectric oil 57 flows through the container 19, the dielectric oil 57 also flows through the server casing 85, and thus through a server 13 itself.

The recess 83 of the manifold 25 is a cutout that extends between a first set of ducts 87 and a second set of ducts 89 of the plurality of ducts 75. The dimensions of the recess 83 are a function of the dimensions of the servers 13 of the system 11. In one or more embodiments, each server 13 of the system 11 includes identical dimensions (e.g., FIG. 2). Alternatively, in one or more embodiments, the system 11 may include servers 13 with varying dimensions. Thus, since the manifold 25 may be a customizable 3D printed structure, the recess 83 of the manifold 25 may be shaped to receive a number of varying servers 13 having differing dimensions (e.g., the width of the recess 83 in the y-direction may not be consistent throughout the length of the recess 83 in the x-direction). Accordingly, in one or more embodiments, the widths of the recess 83 closely match the widths of the servers 13 in the y-direction. In this way, the relatively tight dimensions formed between the recess 83 and the servers 13 in the y-direction laterally fix the servers 13 within the recess 83 of the manifold 25, and thus, the container 19.

More specifically, the dimensions of the recess 83 of the manifold 25 are a function of the dimensions of the server casings 85 of the servers 13 and the container 19. For example, in the case that the container 19 in cylindrical, the maximum length (i.e., measured in the x-direction) of the recess 83, which determines the number of servers 13 that may be supported within the dielectric oil 57 disposed in the container 19, is bounded by the diameter of the cylindrical container 19. In this way, the dimensions of the recess 83, and more generally the size of the manifold 25, is a function of the diameter of the cylindrical container 19. Thus, the diameter of the cylindrical container 19 and the manifold 25 may vary according to the specific number of servers 13 to be cooled by the dielectric oil 57, as well as the volume of dielectric oil 57 necessary to create an appropriate cooling effect of the servers 13. Moreover, the dimensions of the recess 83 may be a function of, for example, the number of servers 13 and the Rack Unit of each server 13 (e.g., 1U, 2U).

A plurality of cavities 91 are formed within the bottom surface of the recess 83. Each cavity 91 is configured to house one or more micropumps 29 of the assembly 17. Here, in the non-limiting example of FIG. 4, each cavity 91 houses two micropumps 29. The plurality of cavities 91 may have a height (i.e., measured in the z-direction) greater than or equal to a height of the micropumps 29 such that the micropumps 29 do not protrude out of the cavities 91 beyond the bottom surface of recess 83. The micropumps 29 may be secured within the cavities 91 by any connection means known to one of ordinary skill in the art (e.g., threaded connections, clamps, bonding agents, compression fit, etc.). In the non-limiting examples of FIG. 4, the micropumps 29 are laterally fixed within micropump indentations 93 of the cavities 91. In particular, each cavity 91 of FIG. 4 includes two micropump indentations 93, each configured to seat a micropump 29. The dimensions of the micropump indentations 93 in the x- and y-directions are closely matched to the dimensions of the micropumps 29 in the x- and y-directions, such that the micropump indentations 93 maintain and bound the positions of the micropumps 29, thereby preventing lateral movements of the micropumps 29.

Each micropump 29 includes an impeller (not shown) housed in a casing (not shown) with a small form factor. The micropumps 29 may be powered by wires (not shown) extending from the power terminal 23. Alternatively, in one or more embodiments, the micropumps 29 may be powered by wires (not shown) extending from the circuit boards of the servers, which receive their power from the power cable 21 and the power terminal 23. While the micropumps 29 are powered and operating, the micropumps 29 induce motion in the dielectric oil 57 such that the dielectric oil 57 is circulated within the system 11. The flow path 59 of the dielectric oil 57 within the system 11 is further detailed in reference to FIG. 6.

In addition, each micropump 29 includes an inlet 95 and an outlet 97. The inlet 95 of each micropump 29 is in fluid communication with a channel 99 of the manifold 25 disposed below the cavity 91 of the micropump 29. In one or more embodiments, the bottom surface of each cavity 91 may include an orifice 101 which fluidly connects the cavity 91 and a channel 99 of the manifold 25. In one or more embodiments, the inlet 95 of a micropump 29 extends through this orifice 101 of the cavity 91 into a channel 99. The manifold 25 includes a plurality of channels 99 that extend beneath the plurality of cavities 91. In FIG. 4, the plurality of channels 99 extend between the first set of ducts 87 and the second set of ducts 89 of the plurality of ducts 75. To this end, the plurality of channels 99 provide fluid communication between the plurality of ducts 75 and the micropumps 29. Consequently, when powered, the inlets 95 of the micropumps 29 may draw and receive dielectric oil 57 entering the manifold 25 through the plurality of ducts 75.

As such, the micropumps 29 increase the pressure of the dielectric oil 57 prior to the dielectric oil 57 being output through the outlets 97 of the micropumps 29. The outlet 97 of each micropump 29 is configured to vent pressurized dielectric oil 57 into a cavity 91 of the manifold 25. In turn, the dielectric oil 57 travels in a vertical direction and exits the cavity 91. Subsequent to the exiting a cavity 91 of the manifold 25, the dielectric oil 57 enters a server 13 situated within the recess 83 of the manifold 25, and thus, above one or more cavities 91 of the plurality of cavities 91. In this way, the plurality of cavities 91 of the manifold 25 form a fluid flow loop (e.g., FIG. 6) that allows the dielectric oil 57 to be circulated through the manifold 25, the plurality of servers 13, and the plurality of shrouds 27.

Returning to FIG. 2, FIG. 2 illustrates how servers 13 may be situated above the cavities 91 of the manifold 25 and their respective micropumps 29. In the non-limiting example of FIG. 2, FIG. 2 depicts the recess 83 of the manifold 25 extending the length of four cavities 91 in the y-direction. However, in other embodiments, the number of cavities 91 extending the length of the recess 83 in the y-direction may be more or fewer. To this end, a single cavity 91 containing a plurality of micropump indentations 93 may extend the length of the recess 83 in the y-direction. Similarly, a plurality of cavities 91 or a single cavity 91 having a plurality of micropump indentations 93 may extend the length of the recess 83 in the x-direction.

Each server 13 disposed within the recess 83 of the manifold 25 may overlay a row of cavities 91. Further, in one or more embodiments, a server 13 disposed within the recess 83 of the manifold 25 may overlay a plurality of rows of cavities 91. In FIG. 2, each server 13 is situated over a row of four cavities 91, and thus, eight micropumps 29. In one or more embodiments, the dimensions of the cavities 91 may be a function of the dimensions of the servers 13. For example, the length of the cavities 91 may be less than or equal to the length of the servers 13 in the x-direction such that the flow of dielectric oil 57 created by the micropumps 29 within the cavities 91 is forced to pass into the servers 13, rather than pass around the servers 13.

Further, in the non-limiting example of FIG. 2, the plurality of servers 13 are depicted as only overlaying a portion of the plurality of cavities 91 of the manifold 25. That is, a number of cavities 91 of the manifold 25 are uncovered by the plurality of servers 13 of FIG. 2. In such a system 11, micropumps 29 may only be provided in cavities 91 that are overlayed by servers 13 in order to conserve energy. Alternatively, in the case that micropumps 29 are disposed within uncovered cavities 91, power may not be provided to these micropumps 29 while the system 11 is in operation. For example, in a case where the micropumps 29 are powered by the servers 13 rather than a dedicated power connection, the micropumps 29 not disposed immediately below a server 13 will not be connected, and thus not receive power.

In one or more embodiments, each row of cavities 91 of the manifold 25 may vary based on the characteristics of the servers 13 of the system 11 being employed. For example, if a specialized server 13 of the system 11 requires additional cooling than other servers 13 of the system 11, a specialized row of cavities 91 fit with additional or more powerful micropumps 29 may be designed to accommodate this specialized server 13 (e.g., the specialized row of cavities 91 may include a greater number of micropumps 29 than the other rows of cavities 91). In this way, the configuration of the manifold 25 can be adapted according to the needs of a particular server 13, collection of servers 13, or multiple separate collections of servers 13.

The total number of micropumps 29 disposed in the manifold 25, or a cardinality of the plurality of the micropumps 29, is configured based upon a heat characteristic of the server 13, or a heat characteristic of a plurality of the servers 13. In this regard, a predetermined heat characteristic may be a maximum thermal output of a plurality of servers 13, a predetermined heat load to be removed from the plurality of servers 13 as a whole, or a specific heat load to be removed from each server 13 of the plurality of servers 13. A predetermined heat characteristic may further encompass other constraints, such as a maximum cooling effect of a particular dielectric oil 57 or second cooling fluid, or the thermal efficiency of the heat transfer processes used by the system 11. Thus, the predetermined heat characteristic is described herein, in a non-limiting fashion, as encompassing any individual or series of thermal properties, economic properties, structural properties, and/or similar considerations that guide the configuration and/or design of the system 11 and components thereof.

Figure 5:
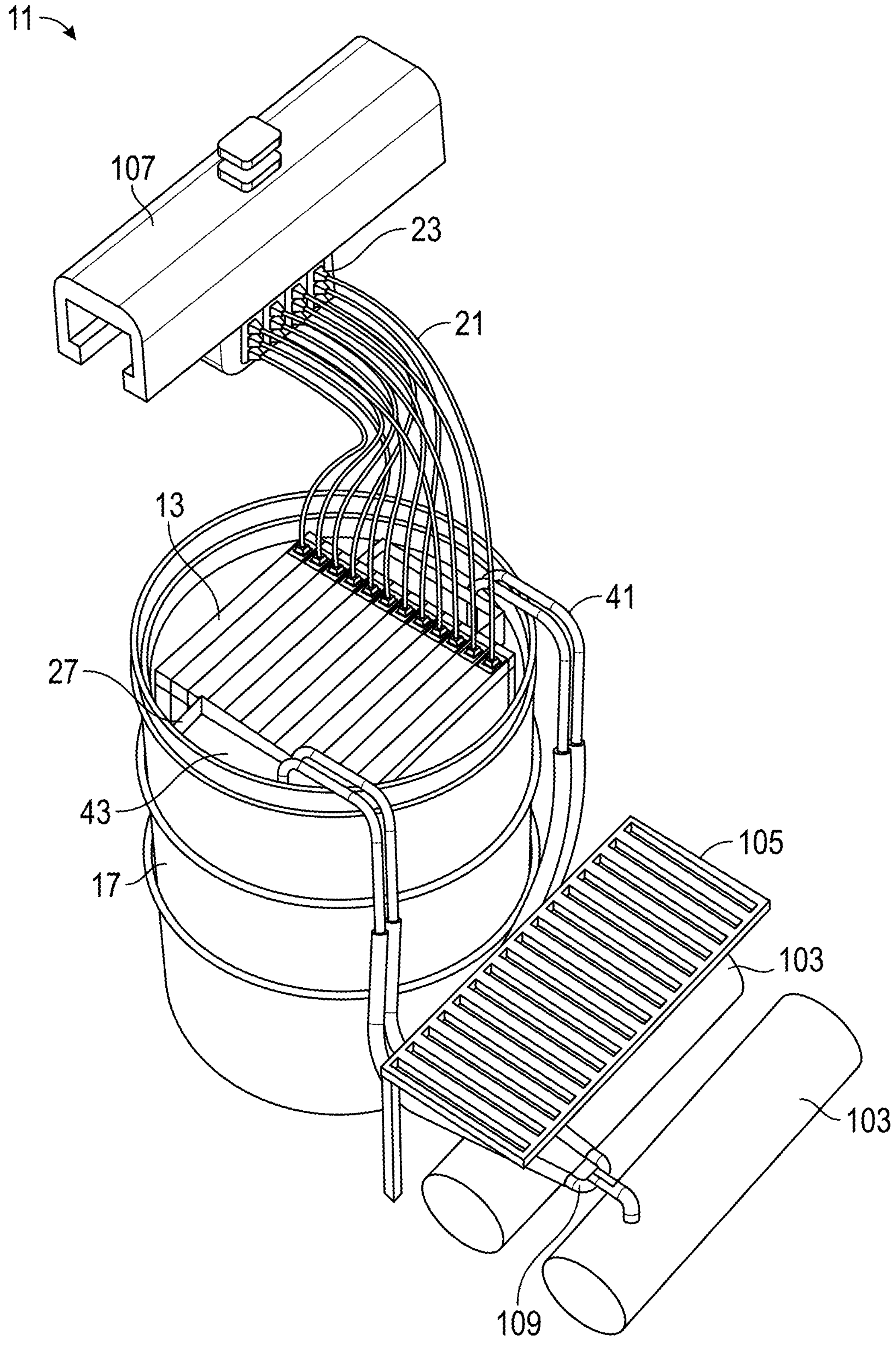
FIG. 5 depicts a system in accordance with one or more embodiments disclosed herein.

Turning to FIG. 5, FIG. 5 depicts a view of the system 11 that encompasses additional elements discussed above but not depicted in FIG. 1. For example, FIG. 5 depicts that a system 11 for providing a cooling immersion environment includes fluid pipes 103 and a footpath 105. The fluid pipes 103 circulate water through the conduits 41 and the radiators 43, such that a first fluid pipe 103 delivers chilled water to the conduits 41 and a second fluid pipe 103 receives warmed water from the conduits 41 that has been heated by the dielectric oil 57. For its part, the footpath 105 provides a surface for an operator of the system 11 to walk above the fluid pipes 103. FIG. 5 further depicts that the system 11 includes a container 19, an assembly 17, radiators 43, conduits 41, and a plurality of servers 13 disposed within the container 19. The heat exchange loop of the system 11 is thus formed by the radiators 43, the conduits 41, and the fluid pipes 103, and serves to remove heat from water contained in the system 11.

The plurality of servers 13 is powered by a power rail 107 that includes power terminals 23, which transfer power to the plurality of servers 13 by power cables 21 that are formed as wires with connecting ends. In relation to FIG. 1, the power rail 107 and the power terminals 23 replace the functionality of the power distribution system 15, such that the power rail 107 is configured to adapt input power to have a suitable phase, voltage, and current for powering the server 13, or otherwise to provide a suitable power without the adaptation thereof. The power terminals 23 are thus similar to the power terminal 23 of the server 13 depicted in FIG. 1, and are formed as dedicated transmission ports for transferring power from the power rail 107 to the plurality of servers 13.

The fluid pipes 103 are tubes for transmitting chilled water to the conduits 41 or receiving warm water therefrom, such that the water is circulated through the system 11 in a closed loop fashion. To this end, the closed loop is formed by virtue of a conduit 41, the fluid pipes 103, and an in-line radiator 43 being formed as a connected structure without a fluid communication path for the water to intermix with the dielectric oil 57. The inlet (not shown) of each conduit 41 is attached, with a y-connector 109 or similar manifold 25, to a fluid pipe 103 that contains chilled water, and the outlet (not shown) of the individual conduit 41 is similarly connected with a y-connector 109 to the fluid pipe 103 that contains warm water. In this way, chilled water is circulated from the first fluid pipe 103, through the conduits 41 and the radiators 43 to absorb heat from the dielectric oil 57, and into the second fluid pipe 103 as warm water. The first fluid pipe 103 containing chilled water may further include a pump (not shown), disposed upstream of the fluid pipe 103, which serves to pressurize and actuate the water in the conduits 41 and the fluid pipe 103. Alternatively, an in-line pump (not shown) may be formed in continuation or as part of a conduit 41, to further reduce the complexity of the system 11 and the assembly thereof.

Figure 6:
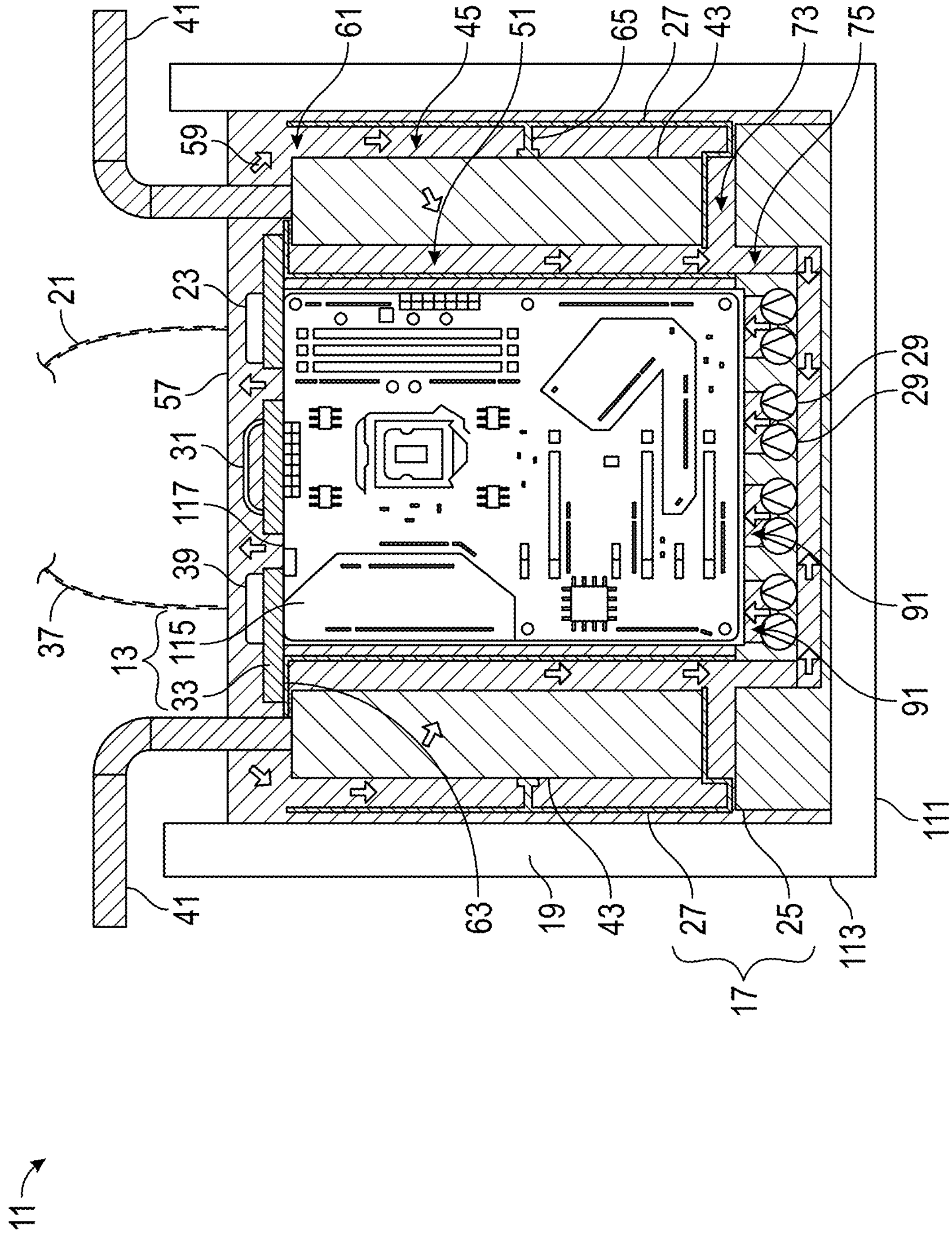
FIG. 6 depicts a cross-sectional view of a system in accordance with one or more embodiments disclosed herein.

FIG. 6 depicts a front cross-sectional view of a system 11 including a server 13, a container 19, and an assembly 17 formed of a manifold 25 and a plurality of shrouds 27. The manifold 25 abuts against a bottom surface 111 and a sidewall 113 of the container 19, and is retained within the container 19 under the force of gravity and the weight of the dielectric oil 57 flowing through the manifold 25, the weight of the server 13 situated within the recess 83 of the manifold 25, and the weight of the plurality of shrouds 27 situated upon the upper surface of the manifold 25. The container 19 retains, with the bottom surface 111 and the sidewall 113, a volume of the dielectric oil 57 such that the manifold 25 and the plurality of shrouds 27 of the assembly 17 are depicted as being fully immersed in the dielectric oil 57.

The manifold 25 itself is formed with a first set of ducts 87 and a second set of ducts 89. A recess 83 of the manifold supports a lower side of a server casing 85 of a circuit board 115 of a server 13 and is formed having a width substantially corresponding to a distance between the first set of ducts 87 and the second set of ducts 89. Components of the circuit board 115 are powered by a connection face 33 of the server 13 as discussed in relation to FIG. 1, where a power terminal 23 of the connection face 33 receives power from a power distribution system 15 or power rail 107 by way of a power cable 21. Similarly, data transmission to and from the server 13 is facilitated by a networking port 39 of the connection face 33 that receives a data cable 37 connected to a network switch 35, as discussed above. A server handle 31 is fixed to the connection face 33 of the server 13 to allow for the removal thereof. Accordingly, the plurality of shrouds 27 may further provide protection to the fragile fins of the radiators 43 disposed therein as servers 13 are added and removed from the system 11.

The circuit board 115 itself includes heat generating components such as processing units (including Central Processing Units (CPUs) and Graphics Processing Units (GPUs)), resistors, microprocessors, storage mediums (i.e., a Random Access Memory (RAM), a Hard Disk Drive (HDD), a Solid State Drive (SSD), etc.), and capacitors, by way of non-limiting examples. The circuit board 115 may further include electrically connective pathways such as printed circuits, buses, ports (such as Peripheral Component Interconnect (PCI) connectors or similar ports), transmitters, receivers, and similar computing components to interconnect various components of the server 13.

To facilitate a removal of the heat produced by the heat generating components of the server 13, the manifold 25 includes a series of micropumps 29 disposed within a plurality of cavities 91 formed within the bottom surface of the recess 83. While the system 11 is powered and operating, the micropumps 29 induce motion in the dielectric oil 57 such that the dielectric oil 57 is circulated within the container 19, the plurality of shrouds 27, and the manifold 25. The motion of the dielectric oil 57 is depicted in FIG. 6 as a fluid flow path 59, which is shown as a series of arrows denoting the direction of the fluid flow of the dielectric oil 57. Although not shown in FIG. 6, the fluid flow path 59 may be routed through the interior of a server casing 85 of the server 13, where the server casing 85 may be a sealed chassis with upper and lower orifices that allow the dielectric oil 57 to pass therethrough. Thus, the server casing 85 ensures that the dielectric oil 57 flows through a server 13 by creating an enclosed structure for the fluid flow to pass through.

As shown in FIG. 6, the dielectric oil 57 initially is agitated by the micropumps 29 disposed within the manifold 25. More specifically, the micropumps 29 draw in the dielectric oil 57 from a plurality of channels 99 of the manifold 25 located beneath the plurality of cavities 91, and thus, below the server 13. Subsequently, the micropumps 29 expel the dielectric oil 57 in a horizontal direction into the cavities 91 of the manifold 25. The cavities 91 are configured with a geometry that directs the dielectric oil 57 to flow in a vertically upward direction such that the dielectric oil 57 flows over components of the circuit board 115. Although not depicted in FIG. 6, the circuit board 115 is surrounded by a server casing 85 as depicted in FIG. 2, and the micropumps 29 are positioned to direct the fluid into and/or through the server casing 85. This causes the dielectric oil 57 to flow through the server 13 and over the heat generating components of the circuit board 115, and the dielectric oil 57 absorbs heat from the circuit board 115 as it flows thereover. After flowing over the circuit board 115, the dielectric oil 57 egresses from the server casing 85 of the server 13 out of connection face orifices 117, which are holes in the connection face 33 of the server 13 to allow for fluid communication through the server casing 85. From the connection face orifices 117, the dielectric oil 57 flows over the connection face 33 and lips 63 of the shrouds 27, and into the openings 61 of the shrouds 27.

In one or more embodiments, the connection face 33 of a server 13 abuts against a lip 63 of each shroud 27 of the plurality of shrouds 27 as depicted in FIG. 6. In this way, upon exiting the server 13, the dielectric oil 57 may flow into an opening 61 of a shroud 27 subsequent to flowing over the connection face 33 and the lip 63 of the shroud 27. In one or more embodiments, the system 11 may include a plurality of servers 13 that vary in height. As such, the heights of the plurality of shrouds 27 may be configured to be less than or equal to the height of the shortest server 13. Thus, solely the connection face 33 of the shortest server 13 may abut against the lip 63 of each shroud 27. In this way, the dielectric oil 57 exiting the shortest server 13 may be drawn relatively laterally towards an opening 61 of a shroud 27 subsequent to flowing over the connection face 33 of the shortest server 13 and the lip 63 of the shroud 27, while the dielectric oil 57 exiting taller servers 13 may be drawn downwards into an opening 61 of a shroud 27 subsequent to flowing over the connection faces 33 of the taller servers 13.

Alternatively, in one or more embodiments, the heights of the plurality of shrouds 27 may be independent of the heights of the servers 13 of the system 11. As such, in one or more embodiments, one or more servers 13 of the system 11 may have a height less than the heights of the plurality of shrouds 27. Here, the dielectric oil 57 exiting servers 13 with heights less than that of the shrouds 27 flows upwards towards an opening 61 of a shroud 27. Accordingly, the flow of the dielectric oil 57 induced by the micropumps 29 is sufficient is transporting the dielectric oil 57 exiting the shorter servers 13 upwards within the container 19 to the openings 61 of the shrouds 27.

As discussed above in relation to FIGS. 2-4, the plurality of ducts 75 of the manifold 25 are in fluid communication with the complementary ducts 73 of the plurality of shrouds 27 while the plurality of shrouds 27 are situated upon the manifold 25. Accordingly, the complementary ducts 73 of the plurality of shrouds 27 are fluidly connected to the plurality of channels 99 of the manifold 25, and thus also in fluid communication with the plurality of micropumps 29. In this way, the suction force exerted from the inlets 95 of the micropumps 29 draws the dielectric oil 57 disposed within the shrouds 27 into the manifold 25.

Subsequent to entering an opening 61 of a shroud 27, the dielectric oil 57 is drawn through a first passage 45 of the shroud 27. The dielectric oil 57 may travel downwards in the first passage 45 until encountering a flow protrusion 65 disposed within the first passage 45 which redirects the dielectric oil 57 to the second passage 51. Upon reaching the flow protrusion 65, the dielectric oil 57 is forced to travel into the second passage 51 of the shroud 27 through the radiator 43.

As discussed above in relation to FIGS. 1-3, each radiator 43 disposed within a shroud 27 is connected to a conduit 41. As also discussed above, the conduit 41 contains a second cooling fluid (not shown), such as water, that is circulated through the radiator 43. The water within the radiator 43 thus absorbs heat from the dielectric oil 57 as the dielectric oil 57 travels around and through the radiator 43. That is, the dielectric oil 57 is cooled within the shroud 27 without intermixing with the second cooling fluid. The water is ultimately transferred by the conduit 41 and the fluid pipe 103 (e.g., FIG. 5) out of the container 19 entirely. As a whole, the system 11 is configured with two, dedicated closed loop cooling fluid circuits that cycle fluid such that the system 11 forms a closed loop immersion cooling environment for removing heat produced by a server 13.

In the non-limiting example of FIG. 6, each shroud 27 includes a single flow protrusion 65. In this way, the dielectric oil 57 is only forced to pass through the radiator 43 once. However, in other embodiments, each shroud 27 may include a plurality of flow protrusions 65 which permit a multi-pass fluid flow of the dielectric oil 57 through the radiators 43. Here, in FIG. 6, subsequent to the dielectric oil 57 entering the second passage 51 of a shroud 27 through the radiator 43, the dielectric oil 57 flows through in the second passage 51 until exiting the shroud 27 through one or more complementary ducts 73 of the shroud 27. It is noted that the induced flow of the dielectric oil 57 is caused by the plurality of micropumps 29, which create a suction phenomenon through the complementary ducts 73 of the shroud 27.

In one or more embodiments, the cross-sectional shape of the complementary ducts 73 is substantially similar to the cross-section shape of the ducts 75 of the manifold 25. In addition, in one or more embodiments, the cross-section shape of the ducts 75 of the manifold 25 may be slightly smaller or larger than the cross-sectional shape of the complementary ducts 73 such that the ducts 75 and the complementary ducts 73 abut against one another when a shroud 27 is positioned upon the manifold 25 (e.g., the interior wall of a duct 75 abuts against the exterior wall of a complementary duct 73). In this way, the dielectric oil 57 passing between the ducts 75 and the complementary ducts 73 is prevented from escaping the assembly 17 prematurely.

Once within the manifold 25, the dielectric oil 57 travels from the plurality of ducts 75 into the plurality of channels 99 and is ultimately received by the micropumps 29 to be recirculated. As discussed above in relation to FIG. 2, each row of cavities 91 of the manifold 25 may vary based on the characteristics of the servers 13 of the system 11 being employed. Accordingly, in one or more embodiments, the position of the cavities 91 and the associated micropumps 29 may vary between each row of cavities 91 in order to accommodate the cooling requirements of different servers 13. Specifically, the micropumps 29 and their cavities 91 may be positioned below specific components of a circuit board 115 of a server 13 that generate a relatively high heat compared to the remainder of the components of the circuit board 115. These specified components are characterized to output a higher heat load than a heat load threshold, for example, as determined by a manufacturer or user of the system 11. The heat load threshold may also be predetermined or calculated by, for example, determining when throttling may occur at a particular heat level. For example, typical operation of a CPU may range between 40 degrees Celsius and 80 degrees Celsius, whereas temperatures in excess of 80 degrees Celsius may incur damage to the CPU and thus, the CPU may be throttled to prevent damage.

The positioning of the micropumps 29 beneath the specified components may ensure the fluid flow of the dielectric oil 57 to have a relatively high volumetric flow rate while passing over the specified component. In turn, this increases the amount of heat removed from the specified component, as the convection effect produced by the high-velocity flow of the dielectric oil 57 is greater than that of a low-velocity flow of the dielectric oil 57.

Figure 7:
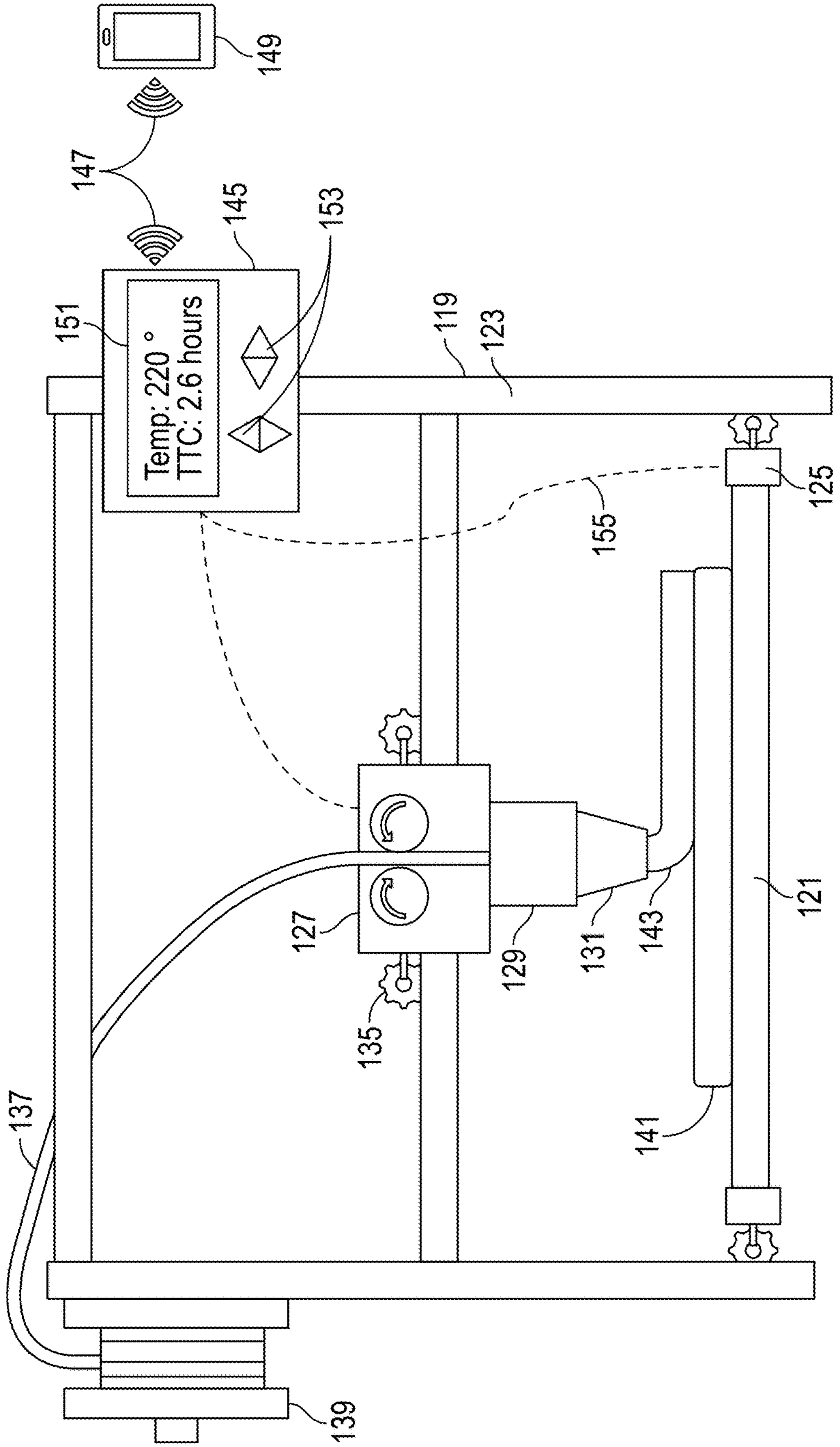
FIG. 7 depicts a 3D printer in accordance with one or more embodiments disclosed herein.

Turing to FIG. 7, FIG. 7 depicts a 3D printer 119 configured to manufacture components of an assembly 17 (i.e., a manifold 25 and a plurality of shrouds 27) consistent with one or more embodiments of the invention as described herein. As is commonly known in the art, example 3D printing processes include, but are not limited to, stereolithography, additive manufacturing, multi-jet fusion, fused deposition modeling, various sintering processes, and other forms of 3D printing not described herein for the sake of brevity. Thus, FIG. 7 presents one sample way of manufacturing the components of an assembly 17 in a fused deposition modeling process, however it will be appreciated that multiple other methods of forming the assembly 17 may be substituted without departing from the nature of this specification.

As shown in FIG. 7, the 3D printer 119 includes a moveable substrate 121 that translates in a vertical direction along a printer frame 123 by way of a vertical conveyance mechanism 125 fixed to the substrate 121. The printer frame 123 is formed as a rack, for example, and a vertical conveyance mechanism 125 is a pinion actuated by a motor such that the printer frame 123 and the vertical conveyance mechanism 125 collectively form a rack and pinion arrangement. The substrate 121 itself is formed as a solid planar surface such as glass or metal, for example.

The 3D printer 119 further includes an extrusion motor 127, a heating body 129, an extrusion nozzle 131, a lateral conveyance mechanism 135, and filament 137 rolled on a filament roller 139 formed as a spool that is fixed to the printer frame 123. The filament 137 includes a thread formed of a material such as carbon fiber, Polyactic Acid (PLA), or Acrylonitrile Butadiene Styrene (ABS), for example. Collectively, the extrusion motor 127, the heating body 129, and the extrusion nozzle 131 serve to heat the filament 137 from a solid to a liquid or semi-liquid state, and deposit the filament 137 onto the substrate 121. In this regard, the extrusion motor 127 includes internal, motor driven sheaves that apply friction forces to the filament 137 to pull the filament 137 into the heating body 129. The heating body 129 is a closed loop heating element, referred to as a hotend, with a heated channel that the filament 137 extends through. As the filament 137 is forced into the heating body 129 by the extrusion motor 127, the heating body 129 warms the filament 137, causing the filament 137 to liquify or semi-liquify. The filament 137 is then translated across the surface of the substrate 121 by actuating the lateral conveyance mechanism 135 fixed to the extrusion nozzle 131. The filament 137 is subsequently deposited onto the substrate 121 in successive, vertically stacked layers, depicted as a first printed layer 141 and a second printed layer 143, to form the components of an assembly 17 described previously.

In one or more embodiments, the manifold 25 is designed for ease of printability by a 3D printer 119. Specifically, every internal passage (i.e., the plurality of ducts 75, the plurality of channels 99, etc.) may be pyramidal-shaped. One of ordinary skill in the art will readily appreciate that 3D printer technologies generally do not require 3D printed support structures (not shown) for overhangs of a 3D printed component of up to 45 degrees. Accordingly, since it may be a difficult and time-consuming process to remove 3D printed supports within a complex 3D printed component such as the manifold 25, the manifold 25 is designed with pyramidal-shaped internal passages having overhangs of 45 degrees or less. Further, in one or more embodiments, in order to mitigate concerns of overhanging features of the manifold 25, the manifold 25 may be designed and 3D printed as two or more vertically stacked pieces. For example, the manifold 25 may be printed as an upper piece and a lower piece that are subsequently stacked and connected to each other.

Furthermore, as discussed above in relation to FIG. 2, each shroud 27 may be formed of a plurality of removably connected body sections 77, 79 and extrinsic flow protrusions 65. Accordingly, each body section 77, 79 and flow protrusion 65 of a shroud 27 is 3D printed separately, thereby potentially reducing the associated manufacturing costs, the required printing time and material required for each print, the need for 3D printed supports, etc. In addition, in one or more embodiments, the support 67 of a shroud 27 may also be individually 3D printed. Subsequently, a shroud 27 may be assembled by connecting the body sections 77, 79, one or more flow protrusions 65, and/or the support 67 (e.g., via snap-fit joints, bonding agents, interference fittings, etc.). During assembly of the shroud 27, in one or more embodiments, a flow protrusion 65 is fixed between the connecting ends of two connected body sections 77, 79.

The actions of the 3D printer 119 are facilitated by a controller 145 fixed to the printer frame 123 of the 3D printer 119. The controller 145 includes internal components and circuitry, such as a processor and a non-transient storage medium (e.g., FIG. 8), that serve to execute instructions to form the components of the assembly 17. To this end, the instructions include a computer readable file storing code interpreted by the controller 145 to guide the movements of the vertical conveyance mechanism 125 and the lateral conveyance mechanism 135. The computer readable file may have a file type such as, but not limited to, an OBJect (OBJ) file type or a STereoLithography (STL) file type, which may be formed using Computer Aided Drafting (CAD)/Computer Aided Manufacturing (CAM) software, for example. Furthermore, the computer readable file may be transmitted to the controller 145 by a wireless data connection 147, such as a Wi-Fi connection, an internet connection, or a Bluetooth connection, formed with a computing device 149 such as a smartphone, tablet, or other computing device.

Various information concerning the 3D printing process is communicated to a user of the 3D printer 119 by way of a display 151 of the controller 145. The various information includes, for example, data such as the temperature of the filament 137 and the Time To Completion (TTC) of the printing process. The display 151 includes an Organic Light Emitting Diode (OLED) or Liquid Crystal Display (LCD) interface, and presents the various information described above to the user. Similarly, the user may interact with the 3D printer 119 by way of buttons 153 of the controller 145, which instruct the controller 145 to operate the vertical conveyance mechanism 125 and/or the lateral conveyance mechanism 135 according to the corresponding button 153 pressed by the user. More specifically, the controller 145 relays instructions to the vertical conveyance mechanism 125 and the lateral conveyance mechanism 135 by way of a wired data connection 155, such as a data cable 37, that transmits the instructions as electrical signals interpreted by the vertical conveyance mechanism 125 and the lateral conveyance mechanism 135.

Once the 3D printer 119 is depositing the filament 137 to form components of an assembly 17, the components of the assembly 17 may include artifacts as a result of small errors in the printing process. For example, if the filament 137 does not cool or heat up at a sufficient rate or to a required temperature, the components of the assembly 17 may be formed with gaps created by the over- or under-extrusion of the filament 137. To remove or prevent the formation of the artifacts, the 3D printing process may further include using a heated substrate 121 or by heating the environment of the 3D printer 119. Similarly, the substrate 121 may be formed with an adhesive layer, or the components of the assembly 17 may be sanded after its formation. Thus, the 3D printing process may be completed with post-processing operations to address potential manufacturing defects of the components of the assembly 17.

Figure 8:
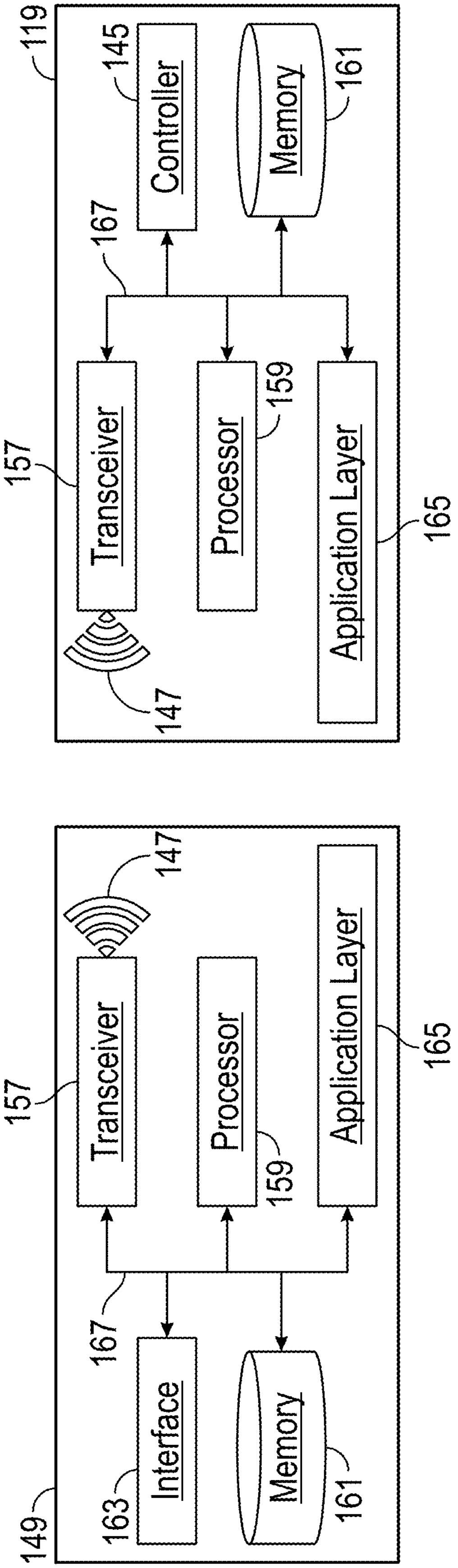
FIG. 8 depicts a computing device and a 3D printer in accordance with one or more embodiments disclosed herein.

Turning to FIG. 8, FIG. 8 presents a detailed overview of the physical hardware used in a 3D printer 119 and a computing device 149, where the computing device 149 represents a smartphone, a tablet, a server, a laptop, a desktop computer, or similar computing devices and systems described herein. As shown in FIG. 8, the 3D printer 119 and the computing device 149 are connected by a wireless data connection 147 formed with transceivers 157. More specifically, each of the transceivers 157 belonging to the computing device 149 and the 3D printer 119 includes components such as photodiodes and photoreceptors, or oscillatory transmission and reception coils that transmit data signals therebetween. The data signals may, for example, be transmitted according to wireless signal transmission protocols, such that the transceivers 157 transmit Wi-Fi, Bluetooth, cellular, or other signals of various forms as described herein. In this way, the transceivers 157 form a wireless data connection 147 that allows for the various data described herein, such as the computer readable file including instruction to form components of an assembly 17 (i.e., a manifold 25 and a plurality of shrouds 27) with a 3D printer 119, to be transmitted between the computing device 149 and the 3D printer 119. In an alternative embodiment, the wireless data connection 147 may be replaced with a physical data connection, such as an ethernet cable or Universal Serial Bus (USB) cable to facilitate a faster data connection.

In addition to a transceiver 157, each of the 3D printer 119 and the computing device 149 include a processor 159. The processor 159 may be formed as a series of microprocessors, an integrated circuit, or associated computing devices that serve to execute computer readable instructions, or code, presented thereto. Similarly, each of the 3D printer 119 and the computing device 149 include a memory 161. The memory 161 is formed as a storage medium such as flash memory, Random Access Memory (RAM), a Hard Disk Drive (HDD), a solid state drive (SSD), a combination thereof, or equivalent devices. Each of the memories 161 store an operating system of its respective device, and well as computer instructions for performing any operations with the associated device. As one example, computer readable code forming an application for translating the computer readable file into a series of movements to 3D print components of an assembly 17 may be stored on the memory 161 of the 3D printer 119. As a second example, the memory 161 of the computing device 149 stores computer readable code to receive input from a user, such as a 3D modelling software used to form a representative model of a manifold 25, for example.

The computing device 149 further includes an interface 163, such as a touchscreen disposed on an OLED or LCD display panel, that allows the user of the computing device 149 to interact therewith. Alternatively, in a desktop computing environment, the interface 163 of the computing device 149 may be embodied as a computer mouse, a monitor, a keyboard, and similar devices that present and/or capture data from the user thereof. On the other hand, the 3D printer 119 receives user input by way of the controller 145, which hosts software and/or applications for interpreting the computer readable file including the models of the components of an assembly 17 as discussed above. In particular, the controller 145 includes buttons 153 and a display 151 that allow the user to interact with and receive data concerning the process of 3D printing the components of the assembly 17 with a 3D printer 119.

Applications utilized by the user, the computing device 149, or the 3D printer 119 as described herein are formed as a software layer depicted in FIG. 8 as an application layer 165 included in each of the 3D printer 119 and the computing device 149. Thus, the application layer 165 includes computer readable code, written in programming languages such as C++, Python, Java, Visual Basic, and/or other languages that form applications presented to and interacted with by the user, the computing device 149, and/or the 3D printer 119. Examples of applications as described herein include software used to model the components of the assembly 17 and computer code for translating the models of the components of the assembly 17 into actuation instructions for the vertical conveyance mechanism 125 and the lateral conveyance mechanism 135, for example. The application layer 165 is stored on the memory 161 or a similar storage device, such that each of the computing device 149 and the 3D printer 119 include a separate application layer 165.

To allow for data transmission between the various components of the 3D printer 119 and the computing device 149, each of the 3D printer 119 and the computing device 149 further include a data bus 167. The data bus 167 is formed as one or more wires, wire terminals, printed circuits, or other electrically connective pathways that allow electric signals to be transmitted between the various components of the 3D printer 119 and the computing device 149. That is, the data bus 167 provides physical connections between each of the transceiver 157, the processor 159, and the memory 161 for data transmission and reception purposes. Thus, the data bus 167 serves to assemble the individual components of the computing device 149 and the 3D printer 119, such as the processor 159, the memory 161, and the transceiver 157, into a functional device.

Figure 9:
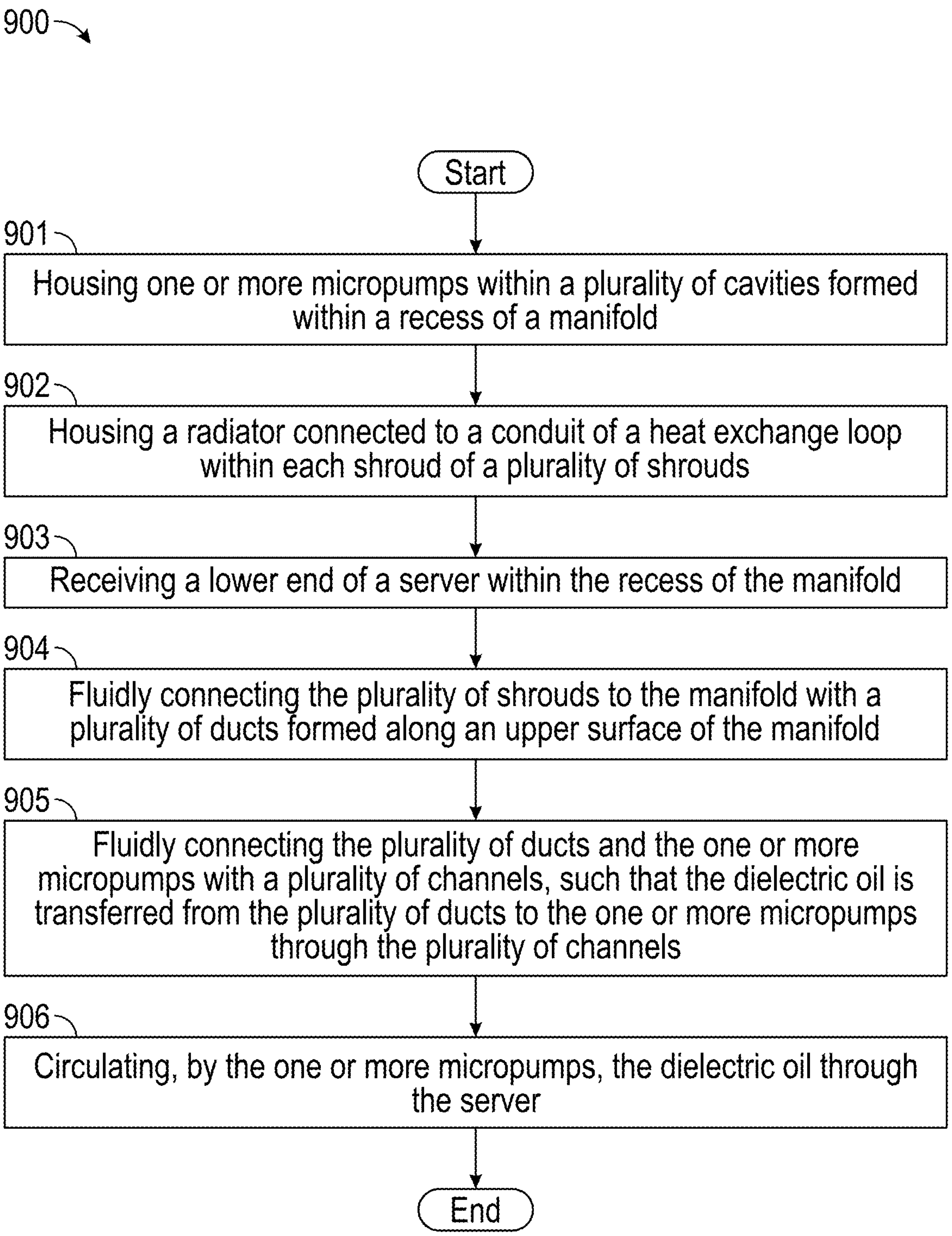
FIG. 9 depicts a flowchart of a process for using an assembly in accordance with one or more embodiments disclosed herein.

Turning to FIG. 9, FIG. 9 depicts a method 900 for using an assembly 17 for directing a fluid flow path 59 of a dielectric oil 57 consistent with one or more embodiments described herein. Steps of FIG. 9 may be performed by a system 11 as described herein, but are not limited thereto. Furthermore, the steps of FIG. 9 may be performed in any order, such that the steps are not limited to the sequence presented. In addition, multiple steps of FIG. 9 may be performed as a single action, or one step may include multiple actions by devices or components described herein.

The method 900 initiates with step 901, which includes housing one or more micropumps 29 within each cavity 91 of the plurality of cavities 91 formed within the recess 83 of the manifold 25. During the assembling process of the assembly 17, the micropumps 29 may be inserted vertically into the cavities 91. In particular, the micropumps 29 may be seated within micropump indentations 93 disposed within each cavity 91. The micropumps 29 may be powered by wires extending from a power terminal 23 of the system 11 and/or wires extending from a circuit board 115 of a server 13 of the system 11. While the micropumps 29 are powered and operating, the micropumps 29 induce motion in the dielectric oil 57 such that the dielectric oil 57 is circulated within the system 11 as further discussed below.

In step 902, a radiator 43 connected to a conduit 41 of a heat exchange loop including a fluid pipe 103 is housed in each shroud 27 of a plurality of shrouds 27. As such, the shrouds 27 encase the radiators 43 and position the attached conduits 41 within a container 19 of the system 11. Each shroud 27 may be a 3D printed structure formed substantially similar to the shape of the radiators 43, and may include a plurality of connected body sections 77, 79. Further, each shroud 27 includes cooling passages 45, 51 within its interior. Specifically, a first passage 45 is formed between a first wall 47 of a shroud 27 and a first side 49 of a radiator 43, and a second passage 51 is formed between a second wall 53 of the shroud 27 and a second side 55 of the radiator 43. In this way, dielectric oil 57 is permitted to flow within the shroud 27 through the first passage 45 and the second passage 51. In addition, each shroud 27 may include one or more flow protrusions 65 which redirect the dielectric oil 57 flowing within a cooling passage to pass through the radiator 43.

A conduit 41 connects from a fluid pipe 103 containing chilled water to a radiator 43 within a shroud 27 such that the chilled water is circulated through the shroud 27 with the conduit 41 and the radiator 43. The conduit 41 further connects from the radiator 43 to a second fluid pipe 103, which carries water out of the system 11, such that the radiator 43 is disposed in line with the conduit 41. Thus, as the water is circulated through the radiator 43 within the shroud 27, the water absorbs heat from the dielectric oil 57 disposed in the shroud 27, and transfers the heat out of the system 11 by one of the fluid pipes 103. The assembly 17 may be formed with at least two shrouds 27, disposed on either side of the recess 83 of the manifold 25, such that the servers 13 of the system 11 are bordered by radiators 43 positioned in the shrouds 27.

Accordingly, in step 903, a server 13 is lowered into the container 19 of the system 11 until a lower end of the server 13 is received within the recess 83 of the manifold 25. The recess 83 is a cutout from the manifold 25 that is sized to accommodate one or more servers 13. As such, a system 11 may include a plurality of servers 13. When situated within the recess 83, circuit boards 115 of the servers 13 are submerged in the dielectric oil 57 within the container 19. In addition, when situated within the recess 83, the servers 13 overlay one or more micropumps 29 disposed within the cavities 91 formed within the recess 83, such that the system 11 as a whole forms an immersed cooling environment for the servers 13.

The manifold 25 is a 3D printed structure that includes various internal passages further described below, and serves to direct a fluid flow of the dielectric oil 57 through the manifold 25 and through the servers 13. The manifold 25 is disposed in the container 19 such that the manifold 25 abuts against a bottom surface 111 and a sidewall 113 of the container 19.

In step 904, the plurality of shrouds 27 are fluidly connected to the manifold 25. Specifically, the plurality of shrouds 27 are lowered within the container 19 until the shrouds 27 are positioned upon an upper surface of the manifold 25. To this end, a shroud 27 is positioned and secured upon the manifold 25 by coupling a plurality of complementary ducts 73 of the shroud 27 to a plurality of ducts 75 of the manifold 25. Subsequent to the plurality of ducts 75 of the manifold 25 and the plurality of complementary ducts 73 of the shrouds 27 being coupled together, the manifold 25 and the shrouds 27 are in fluid communication between the ducts 75 and the complementary ducts 73. The complementary ducts 73 may be embodied as apertures configured to receive ducts 75 of the manifold 25 and/or as tubular protrusions configured to extend into the ducts 75 of the manifold 25.

In step 905, the plurality of ducts 75 are fluidly connected to the micropumps 29 situated within the manifold 25 through a plurality of channels 99 of the manifold 25. The plurality of channels 99 are internal passages disposed below the cavities 91 of the manifold 25 and extend between a first set of ducts 87 fluidly connected to a first shroud 27 and a second set of ducts 89 fluidly connected to a second shroud 27 of the assembly 17. Each cavity 91 may include an orifice 101 disposed at its bottom surface. The orifice 101 provides fluid communication between the plurality of channels 99 and the cavities 91. To this end, an inlet 95 of each micropump 29 may extend into an orifice 101, thereby fluidly connecting the micropumps 29 and the plurality of channels 99. In this way, dielectric oil 57 entering the manifold 25 through the plurality of ducts 75 is drawn through the plurality of channels 99 to the micropumps 29 by a suction force created by the micropumps 29 when powered.

In step 906, the dielectric oil 57 is circulated through the servers 13 of the system 11 by the micropumps 29. As discussed previously in step 905, the micropumps 29 create a suction force and draw in dielectric oil 57 from the plurality of cavities 91 through their inlets 95. Subsequently, the micropumps 29 increase the pressure of the dielectric oil 57 and vent the pressurized dielectric oil 57 through the plurality of cavities 91 in a vertically upward direction and into the lower ends of the servers 13. As the dielectric oil 57 flows through the servers 13, the dielectric oil 57 absorbs heat from components of the circuit boards 115 of the servers 13, and moves the heat to a different location of the assembly 17 to be removed from the system 11 entirely. In particular, after flowing over the circuit boards 115, the dielectric oil 57 egresses from the servers 13 and then flows into openings 61 of the plurality of shrouds 27. In this way, the dielectric oil 57 is circulated through the plurality of shrouds 27, which house the radiators 43 as described above, such that the water in the radiators 43 absorbs heat from the dielectric oil 57 as the dielectric oil 57 flows past and/or through the radiators 43.

The complementary ducts 73 of the shrouds 27 are fluidly connected to the ducts 75 of the manifold 25, which are fluidly connected to the plurality of channels 99. Thus, because the micropumps 29 are fluidly connected to the plurality of channels 99, the suction force of the micropumps 29 draws the dielectric oil 57 within the shrouds 27 into the manifold 25 towards the micropumps 29. That is, the dielectric oil 57 exits the shrouds 27 through the complementary ducts 73 and enters the manifold 25 through the ducts 75. Subsequently, the dielectric oil 57 is drawn from the ducts 75 into the plurality of channels 99. The micropumps 29 then proceed to re-agitate or induce motion in the dielectric oil 57 such that the dielectric oil 57 proceeds to reflow, in an iterative fashion, through the servers 13. Thus, the method 900 completes with the recirculation of the dielectric oil 57 within the container 19 in a closed loop fluid flow path 59 formed by the internal passages of the manifold 25 (i.e., the plurality of ducts 75 and the plurality of channels 99), the plurality of shrouds 27, and the servers 13.

Although only a few example embodiments have been described in detail above, those skilled in the art will readily appreciate that many modifications are possible in the example embodiments without materially departing from this invention. For example, the number of shrouds 27, and thus, the number of radiators 43 may differ than presently depicted when designing a system 11 to ensure a desired cooling effect of the system 11. Furthermore, the dimensions of the cavities 91 of the manifold 25 or the body sections 77, 79 of a shroud 27 may vary due to material cost savings. In addition, many modifications will be appreciated by those skilled in the art to adapt a particular instrument, situation, or material to embodiments of the disclosure without departing from the essential scope thereof. Accordingly, all such modifications are intended to be included within the scope of this disclosure as defined in the following claims.

Unless otherwise indicated, all numbers expressing quantities used in the present specification and associated claims are to be understood as being modified in all instances by the term "about." Accordingly, unless indicated to the contrary, the numerical parameters set forth in the following specification and attached claims are approximations that may vary depending upon the desired properties sought to be obtained by one or more embodiments described herein. At the very least, and not as an attempt to limit the application of the doctrine of equivalents to the scope of the claim, each numerical parameter should at least be construed in light of the number of reported significant digits and by applying ordinary rounding techniques.

Embodiments of the present disclosure may provide at least one of the following advantages: cost savings, material savings, ease of assembly, ease of maintenance, and an increased amount of heat removed from a system 11 including a server 13. Cost and material savings are realized by forming the assembly 17 as a structure that fits inside of widely available containers 19 (e.g., barrels), and are further realized by forming the component of the assembly 17 with 3D manufacturing processes. Ease of assembly and ease of maintenance may be realized by forming the components of the assembly 17 as removably connectable, 3D printed components. Further, the amount of heat removed from the server 13 is increased as a function of immersing the server 13 in a dynamic fluid flow of a dielectric oil 57 that transfers heat away from the server 13, and subsequently removing the heat from the dielectric oil 57 with a second cooling liquid.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed is:

1. An assembly for directing a fluid flow of a dielectric oil through a server, the assembly comprising:
- a plurality of shrouds, each shroud configured to house a radiator that is connected to a conduit of a heat exchange loop; and
- a manifold configured to be removably coupled to the plurality of shrouds comprising:
  - a plurality of ducts, formed along an upper surface of the manifold, configured to fluidly connect to the plurality of shrouds;
  - a recess configured to receive a lower end of the server;
  - a plurality of cavities formed within the recess, each cavity being configured to house one or more micropumps configured to circulate the dielectric oil through the server; and
  - a plurality of channels configured to fluidly connect the one or more micropumps and the plurality of ducts, such that the dielectric oil is transferred from the plurality of ducts to the one or more micropumps through the plurality of channels.

2. The assembly of claim 1, wherein each shroud comprises a plurality of complementary ducts configured to abut against the plurality of ducts of the manifold.

3. The assembly of claim 1, wherein each shroud comprises:
- a first passage for the dielectric oil formed between a first wall of the shroud and a first side of the radiator; and
- a second passage for the dielectric oil formed between a second wall of the shroud and a second side of the radiator.

4. The assembly of claim 3, wherein each shroud further comprises a lip disposed at an upper end of the shroud, the lip being configured to force the dielectric oil to enter the shroud through the first passage.

5. The assembly of claim 3, wherein each shroud further comprises a flow protrusion disposed within the first passage and configured to abut against a side of the radiator, such that the flow protrusion redirects the dielectric oil within the first passage above the flow protrusion to flow through the radiator.

6. The assembly of claim 1, wherein each shroud is formed of a plurality of body sections configured to removably connect to one another.

7. The assembly of claim 1, wherein each micropump comprises:
- an inlet configured to receive the dielectric oil from a channel of the plurality of channels through an orifice disposed along a bottom of a cavity of the plurality of cavities; and
- an outlet configured to pump the dielectric oil into the cavity, thereby circulating the dielectric oil within the cavity in a vertical direction through the lower end of the server.

8. The assembly of claim 1, wherein each cavity of the manifold comprises a plurality of micropump indentations configured to maintain a position of each micropump within the cavity.

9. The assembly of claim 1, wherein the manifold is formed with a substantially cylindrical profile configured with a first diameter that is smaller than a second diameter of a container, such that the manifold is configured with a profile sized to fit within the container.

10. The assembly of claim 1, wherein the recess is disposed between a first set of ducts of the plurality of ducts and a second set of ducts of the plurality of ducts.

11. The assembly of claim 1, wherein the manifold and the plurality of shrouds are each formed as a 3D printed structure by depositing a filament on a substrate in successive, vertically stacked layers with an extrusion nozzle of a 3D printer controlled by a computing device.

12. The assembly of claim 1, wherein the recess of the manifold is configured to receive a plurality of servers including the server along the manifold.

13. The assembly of claim 12, wherein a cardinality of the one or more micropumps is configured based on a heat characteristic of the plurality of servers, where the heat characteristic comprises: a maximum thermal output of the plurality of servers, a predetermined heat load to be removed from the plurality of servers as a whole, or a specific heat load to be removed from each server of the plurality of servers.

14. A method utilizing an assembly to direct a fluid flow of a dielectric oil through a server, the method comprising:
- housing one or more micropumps within a plurality of cavities formed within a recess of a manifold;
- housing a radiator connected to a conduit of a heat exchange loop within each shroud of a plurality of shrouds;
- receiving a lower end of the server within the recess of the manifold;
- fluidly connecting the plurality of shrouds to the manifold with a plurality of ducts formed along an upper surface of the manifold;
- fluidly connecting the plurality of ducts and the one or more micropumps with a plurality of channels, such that the dielectric oil is transferred from the plurality of ducts to the one or more micropumps through the plurality of channels; and
- circulating, by the one or more micropumps, the dielectric oil through the server.

15. The method of claim 14, wherein fluidly connecting the plurality of shrouds to the manifold comprises:
- abutting a plurality of complementary ducts of each shroud against the plurality of ducts of the manifold.

16. The method of claim 14, further comprising:
- forming the plurality of shrouds by connecting a plurality of body sections of each shroud.

17. The method of claim 14, further comprising: redirecting, by a flow protrusion disposed within a first passage of each shroud and abutting against a side of the radiator, the dielectric oil disposed within the first passage above the flow protrusion to flow through the radiator.

18. The method of claim 14, further comprising: forming the manifold and the plurality of shrouds each as a 3D printed structure by depositing a filament on a substrate in successive, vertically stacked layers with an extrusion nozzle of a 3D printer controlled by a computing device.

19. The method of claim 14, further comprising: receiving, by an inlet of each micropump, the dielectric oil from a channel of the plurality of channels through an orifice disposed along a bottom of a cavity of the plurality of cavities; and venting, by an outlet of each micropump, the dielectric oil into the cavity, thereby circulating the dielectric oil within the cavity in a vertical direction through the lower end of the server.

20. A non-transitory computer readable medium storing instructions, executed by a processor of a 3D printer, causing the 3D printer to form an assembly by:

depositing a filament on a substrate in successive, vertically stacked layers with an extrusion nozzle of the 3D printer to form components of the assembly such that the assembly comprises:

a plurality of shrouds, each shroud configured to house a radiator that is connected to a conduit of a heat exchange loop; and a manifold configured to be removably coupled to the plurality of shrouds comprising:

a plurality of ducts, formed along an upper surface of the manifold, configured to fluidly connect to the plurality of shrouds;

a recess configured to receive a lower end of a server;

a plurality of cavities formed within the recess, each cavity being configured to house one or more micropumps configured to circulate a dielectric oil through the server; and a plurality of channels configured to fluidly connect the one or more micropumps and the plurality of ducts, such that the dielectric oil is transferred from the plurality of ducts to the one or more micropumps through the plurality of channels.

* * * * *